(12) United States Patent
Rawat et al.

(10) Patent No.: US 12,176,025 B2
(45) Date of Patent: Dec. 24, 2024

(54) ADAPTIVE BODY BIAS MANAGEMENT FOR AN IN-MEMORY COMPUTE OPERATION WHERE SIMULTANEOUS ACCESS IS MADE TO PLURAL ROWS OF A STATIC RANDOM ACCESS MEMORY (SRAM)

(71) Applicant: STMicroelectronics International N.V., Geneva (CH)

(72) Inventors: Harsh Rawat, Faridabad (IN); Kedar Janardan Dhori, Ghaziabad (IN); Promod Kumar, Greater Noida (IN); Nitin Chawla, Noida (IN); Manuj Ayodhyawasi, Noida (IN)

(73) Assignee: STMicroelectronics International N.V., Geneva (CH)

( * ) Notice: Subject to any disclaimer, the term of this patent is extended or adjusted under 35 U.S.C. 154(b) by 254 days.

(21) Appl. No.: 17/844,955

(22) Filed: Jun. 21, 2022

(65) Prior Publication Data

US 2023/0012567 A1    Jan. 19, 2023

Related U.S. Application Data

(60) Provisional application No. 63/220,088, filed on Jul. 9, 2021.

(51) Int. Cl.
*G11C 11/412* (2006.01)
*G11C 11/418* (2006.01)
*G11C 11/419* (2006.01)

(52) U.S. Cl.
CPC .......... *G11C 11/418* (2013.01); *G11C 11/412* (2013.01); *G11C 11/419* (2013.01)

(58) Field of Classification Search
CPC ... G11C 11/418; G11C 11/412; G11C 11/419; G11C 7/1006; G11C 8/08; G11C 11/54
See application file for complete search history.

(56) References Cited

U.S. PATENT DOCUMENTS 6,198,671 B1    3/2001  Aoyama et al.
6,282,137 B1    8/2001  Lee et al.
(Continued)

FOREIGN PATENT DOCUMENTS

CN    110503995 A    11/2019
EP    0461430 A1    12/1991
(Continued)

OTHER PUBLICATIONS

Lin, Zhiting, et al.: "Cascade Current Mirror to Improve Linearity and Consistency in SRAM In-Memory Computing," IEEE Journal of Solid-State Circuits, vol. 56, No. 8, Aug. 2021, 13 pgs.

(Continued)

*Primary Examiner* — Mushfique Siddique
(74) *Attorney, Agent, or Firm* — Crowe & Dunlevy LLC

(57) ABSTRACT

An in-memory computation circuit includes a memory array with SRAM cells connected in rows by word lines and in columns by bit lines. Body bias nodes of the transistors in each SRAM cell are biased by a modulated body bias voltage. A row controller circuit simultaneously actuates word lines in parallel for an in-memory compute operation. A column processing circuit processes analog voltages developed on the bit lines in response to the simultaneous actuation to generate a decision output for the in-memory compute operation. A voltage generator circuit switches the modulated body bias voltage from a non-negative voltage level to a negative voltage level during the simultaneous actuation. The negative voltage level is adjusted dependent on integrated circuit process and/or temperature conditions in order to optimize protection against unwanted memory cell data flip.

51 Claims, 10 Drawing Sheets

(56) References Cited

U.S. PATENT DOCUMENTS

| | | |
|---|---|---|
| 6,529,400 B1 | 3/2003 | Bhavnagarwala et al. |
| 6,785,161 B2 | 8/2004 | Pekny |
| 7,120,061 B2 | 10/2006 | Daga |
| 7,173,837 B1 | 2/2007 | Bettman et al. |
| 7,227,769 B2 | 6/2007 | Fukushi et al. |
| 7,289,354 B2 | 10/2007 | Houston |
| 7,342,845 B2 | 3/2008 | Somasekhar et al. |
| 7,502,247 B2 | 3/2009 | Houston |
| 7,508,697 B1* | 3/2009 | Mukhopadhyay ... G11C 29/028 365/189.09 |
| 7,525,834 B2 | 4/2009 | Sohn |
| 7,564,725 B2 | 7/2009 | Houston |
| 7,570,527 B2 | 8/2009 | Houston |
| 7,742,326 B2 | 6/2010 | Houston |
| 7,760,575 B2 | 7/2010 | Tooher et al. |
| 7,773,407 B2 | 8/2010 | Huang et al. |
| 7,813,163 B2 | 10/2010 | Pille et al. |
| 8,004,907 B2 | 8/2011 | Russell et al. |
| 8,064,241 B2 | 11/2011 | Morita et al. |
| 8,134,874 B2 | 3/2012 | Shiu et al. |
| 8,213,257 B2 | 7/2012 | Chuang et al. |
| 8,441,829 B2* | 5/2013 | Huang ................ G11C 11/412 365/49.1 |
| 8,451,652 B2 | 5/2013 | Seikh et al. |
| 8,559,248 B2 | 10/2013 | Dally et al. |
| 8,947,970 B2 | 2/2015 | Pelley et al. |
| 8,966,329 B2 | 2/2015 | Clark et al. |
| 8,971,146 B2 | 3/2015 | Sharpe-Geisler et al. |
| 9,001,579 B2 | 4/2015 | Song et al. |
| 9,013,949 B2 | 4/2015 | Schreiber et al. |
| 9,087,566 B2 | 7/2015 | Song et al. |
| 9,142,284 B2 | 9/2015 | Lee et al. |
| 9,147,451 B2 | 9/2015 | Chong et al. |
| 9,263,121 B2 | 2/2016 | Karl et al. |
| 9,286,952 B2 | 3/2016 | McLaury |
| 9,336,865 B1 | 5/2016 | Chu et al. |
| 9,455,023 B1 | 9/2016 | Xu et al. |
| 9,799,393 B1 | 10/2017 | Ramamurthy et al. |
| 9,831,852 B2 | 11/2017 | Boakye et al. |
| 9,928,898 B2 | 3/2018 | Sahu et al. |
| 9,953,699 B2 | 4/2018 | Ichihashi |
| 9,953,986 B2 | 4/2018 | Wang |
| 9,997,236 B1 | 6/2018 | Pathak |
| 10,319,434 B2 | 6/2019 | Jung et al. |
| 10,403,629 B2 | 9/2019 | Mann et al. |
| 10,541,013 B1 | 1/2020 | Schreiber et al. |
| 10,559,573 B2 | 2/2020 | Wang et al. |
| 10,642,922 B2* | 5/2020 | Knag .................. G11C 11/54 |
| 10,650,909 B2 | 5/2020 | Chen et al. |
| 10,679,694 B2 | 6/2020 | Kumar et al. |
| 10,685,703 B2 | 6/2020 | Singh et al. |
| 10,748,911 B2 | 8/2020 | Singh et al. |
| 10,796,732 B2 | 10/2020 | Yoshihara et al. |
| 10,811,088 B2 | 10/2020 | Raj et al. |
| 11,048,434 B2 | 6/2021 | Kumar et al. |
| 2002/0105825 A1 | 8/2002 | Marshall et al. |
| 2006/0044018 A1 | 3/2006 | Chang |
| 2008/0144365 A1* | 6/2008 | Yamaoka ............. G11C 11/417 365/181 |
| 2009/0046519 A1 | 2/2009 | Wang et al. |
| 2011/0261633 A1 | 10/2011 | Chandra et al. |
| 2014/0185364 A1 | 7/2014 | Iyer et al. |
| 2014/0204657 A1 | 7/2014 | Dally |
| 2015/0179232 A1 | 6/2015 | Felix et al. |
| 2016/0232951 A1 | 8/2016 | Shanbhag et al. |
| 2018/0012648 A1 | 1/2018 | Ichihashi |
| 2019/0042160 A1 | 2/2019 | Kumar et al. |
| 2019/0042199 A1* | 2/2019 | Sumbul ................. G11C 7/12 |
| 2019/0198093 A1 | 6/2019 | Khellah et al. |
| 2020/0075090 A1 | 3/2020 | Kumar et al. |
| 2020/0082876 A1* | 3/2020 | Singh ................... G11C 11/419 |
| 2021/0035614 A1 | 2/2021 | Schreiber |

FOREIGN PATENT DOCUMENTS

| | | |
|---|---|---|
| EP | 3437098 B1 | 7/2019 |
| KR | 1020200091697 A | 7/2020 |
| WO | 0051131 A1 | 8/2000 |

OTHER PUBLICATIONS

Zhang, Jintao, et al.: "In-Memory Computation of a Machine-Learning Classifier in a Standard 6T SRAM Array," IEEE Journal of Solid-State Circuits, vol. 52, No. 4, Apr. 2017, 10 pgs.

Definition of "Buffer Amplifier," Wikipedia, 2021, 6 pgs.

Chang, Chip-Hong, et al.: "Sizing of SRAM Cell with Voltage Biasing Techniques for Reliability Enhancement of Memory and PUF Functions," Journal of Low Power Electronics and Applications, 2016, 6, 16; doi:10.3390/jlpea6030016, 17 pgs.

Agrawal, Amogh, et al: X-SRAM: Enabling In-Memory Boolean Computations in CMOS Static Random Access Memories, IEEE Transactions on Circuits and Systems-I: Regular Papers, vol. 65, No. 12, Dec. 2018.

Biswas, Avishek, et al: CONF-SRAM: An Energy-Efficient SRAM With In-Memory Dot-Product Computation for Low-Power Convolution for Low-Power Convolutional Neural Networks, IEEE Journal of Solid-State Circuits, vol. 54, No. 1, Jan. 2019.

Biswas, Avishek: "Energy-Efficient Smart Embedded Memory Design for IoT and AI," Massachusetts Institute of Technology, Jun. 2018.

Dong, Qing, et al: A 351TOPS/W and 372.4GOPS Compute-in-Memory SRAM Macro in 6nm FinFET CMOS for Machine-Learning Applications, ISSCC 2020, Session 15, SRAM & Compute-In-Memory, 15.3.

H. Jia et al., 15.1 A Programmable Neural-Network Inference Accelerator Based on Scalable In-Memory Computing, 2021 IEEE International Solid-State Circuits Conference (ISSCC), 2021, pp. 236-238, doi: 10.1109/ISSCC42613.2021.9365788.

H. Jia et al., Scalable and Programmable Neural Network Inference Accelerator Based on In-Memory Computing, in IEEE Journal of Solid-State Circuits, vol. 57, No. 1, pp. 198-211, Jan. 2022, doi: 10.1109/JSSC.2021.3119018.

J.-W. Su et al., 16.3 A 28nm 384kb 6T-SRAM Computation-in-Memory Macro with 8b Precision for AI Edge Chips, 2021 IEEE International Solid-State Circuits Conference (ISSCC), 2021, pp. 250-252, doi: 10.1109/ISSCC42613.2021.9365984.

J. Lee, H. Valavi, Y. Tang and N. Verma, Fully Row/Column-Parallel In-memory Computing SRAM Macro employing Capacitor-based Mixed-signal Computation with 5-b Inputs, 2021 Symposium on VLSI Circuits, 2021, pp. 1-2, doi: 10.23919/VLSICircuits52068.2021.9492444.

Jia, Hongyang, et al: A Microprocessor Implemented in 65nm CMOS with Configurable and Bit-scalable Accelerator for Programmable In-memory Computing, IEEE Journal of Solid-State Circuits, vol. 55, No. 9, pp. 2609-2621, Sep. 2020.

Jia, Hongyang, et al: A Programmable Heterogeneous Microprocessor Based on Bit-Scalable In-Memory Computing, IEEE Journal of Solid-State Circuits, vol. 55, No. 9, Sep. 2020.

Jiang, Zhewei, et al: C3SRAM: An In-Memory-Computing SRAM Macro Based on Robust Capacitive Coupling Computing Mechanism, IEEE Journal of Solid-State Circuits, vol. 55, No. 7, Jul. 2020.

Kang, Mingu, et al: A Multi-Functional In-Memory Inference Processor Using a Standard 6T SRAM Array, IEEE Journal of Solid-State Circuits, vol. 53, No. 2, Feb. 2018.

Kim, Jinseok, et al: Area-Efficient and Variation-Tolerant In-Memory BNN Computing using 6T SRAM Array, 2019 Symposium on VLSI Circuits Digest of Technical Papers.

Si, Xin, et al: A 28nm 64Kb 6T SRAM Computing-in-Memory Macro with 8b MAC Operation for AI Edge Chips, ISSCC 2020, Session 15, SRAM & Compute-In-Memorya, 15.5.

Si, Xin, et al: A Twin-8T SRAM Computation-In-Memory Macro for Multipe-Bit CNN-Based Machine Learning, ISSCC 2019, Session 24, SRAM & Computation-In-Memory, 24.5.

Singh, Jawar, et al: "A 2-Port 6T SRAM Bitcell Design with Multi-Port Capabilities at Reduced Area Overhead," 2010 IEEE.

(56) References Cited

OTHER PUBLICATIONS

Su, Jian-Wei, et al: A 28nm 64Kb Inference-Taining Two-Way Transpose Multibit 6T SRAM Compute-in-Memory Macro for AI Edge Chips, ISSCC 2020, Session 15, SRAM & Compute-In-Memory, 15.2.

V. K. Rajanna, S. Taneja and M. Alioto, SRAM with In-Memory Inference and 90% Bitline Activity Reduction for Always-On Sensing with 109 TOPS/mm2 and 749-1,459 TOPS/W in 28nm, ESSDERC 2021—IEEE 51st European Solid-State Device Research Conference (ESSDERC), 2021, pp. 127-130, doi: 10.1109/ESSDERC53440.2021.9631782.

Valavi, Hossein, et al: A 64-Tile 2.4-Mb In-Memory-Computing CNN Accelerator Employing Charge-Domain Compute, IEEE Journal of Solid-State Circuits, vol. 54, No. 6, Jun. 2019.

Y.-D. Chih et al., 16.4 An 89TOPS/W and 16.3TOPS/mm2 All-Digital SRAM-Based Full-Precision Compute-In Memory Macro in 22nm for Machine-Learning Edge Applications, 2021 IEEE International Solid-State Circuits Conference (ISSCC), 2021, pp. 252-254, doi: 10.1109/ISSCC42613.2021.9365766.

Yin, Shihui, et al.: XNOR-SRAM: In-Memory Computing SRAM Macro for Binary/Ternary Deep Neural Networks, IEEE Journal of So.id-State Circuits, vol. 55, No. 6, Jun. 2020.

Z. Chen, X. Chen and J. Gu, 15.3 A 65nm 3T Dynamic Analog RAM-Based Computing-in-Memory Macro and CNN Accelerator with Retention Enhancement, Adaptive Analog Sparsity and 44TOPS/W System Energy Efficiency, 2021 IEEE International Solid-State Circuits Conference (ISSCC), 2021, pp. 240-242, doi: 10.1109/ISSCC42613.2021.9366045.

Zhang, Jintao, et al: In-Memory Computation of a Machine-Learning Classifier in a Standard 6T SRAM Array, IEEE Journal of Solid-State Circuits, vol. 52, No. 4, Apr. 2017.

Luo, Shien-Chun, et al: "A Subthreshold SRAM Cell with Autonomous Bitline-Voltage Clamping," 2010 IEEE.

Lorenzo, Rohit, et al: "A novel 9T SRAM architecture for low leakage and high performance," Analog Integrated Circuits and Signal Processing, 92, 315-325 (2017).

Kushwah, C.B., et al: "Single-Ended Boost-Less (SE-BL) 7T Process Tolerant SRAM Design in Sub-threshold Regime for Ultra-Low-Power Applications," Springer Link, Jun. 3, 2015.

\* cited by examiner

ADAPTIVE BODY BIAS MANAGEMENT FOR AN IN-MEMORY COMPUTE OPERATION WHERE SIMULTANEOUS ACCESS IS MADE TO PLURAL ROWS OF A STATIC RANDOM ACCESS MEMORY (SRAM)

CROSS REFERENCE TO RELATED APPLICATIONS

This application claims priority from U.S. Provisional Application for Patent No. 63/220,088, filed Jul. 9, 2021, the disclosure of which is incorporated by reference.

TECHNICAL FIELD

Embodiments relate to an in-memory computation circuit utilizing a static random access memory (SRAM) array and, in particular, to a circuit for controlling a body bias voltage applied to transistors of the memory cells for the SRAM array during an in-memory compute operation where simultaneous access is made to multiple rows of the SRAM array.

BACKGROUND

Reference is made to FIG. 1 which shows a schematic diagram of an in-memory computation circuit 10. The circuit 10 utilizes a static random access memory (SRAM) array 12 formed by standard 6T SRAM memory cells 14 arranged in a matrix format having N rows and M columns. As an alternative, any bit cell with a similar topology and/or functionality could instead be used. Each memory cell 14 is programmed to store, for example, a bit of a computational weight for an in-memory compute operation. In this context, the in-memory compute operation is understood to be a form of a high dimensional Matrix Vector Multiplication (MVM) supporting multi-bit weights that are stored in multiple bit cells of the memory. The group of bit cells (in the case of a multibit weight) can be considered as a virtual synaptic element. Each bit of the computational weight has either a logic "1" or a logic "0" value.

Each SRAM cell 14 includes a word line WL and a pair of complementary bit lines BLT and BLC. The cells 14 in a common row of the matrix are connected to each other through a common word line WL. The cells 14 in a common column of the matrix are connected to each other through a common pair of complementary bit lines BLT and BLC. Each word line WL is driven by a word line driver circuit 16 which may be implemented as a CMOS driver circuit (for example, a series connected p-channel and n-channel MOSFET transistor pair forming a logic inverter circuit). The word line signals applied to the word lines, and driven by the word line driver circuits 16, are generated from feature data input to the in-memory computation circuit 10 and controlled by a row controller circuit 18. A column processing circuit 20 senses the analog signal voltages on the pairs of complementary bit lines BLT and BLC for the M columns and generates a decision output for the in-memory compute operation from those analog signal voltages. The column processing circuit 20 can be implemented to support processing where the voltages on the columns are first processed individually and then followed by a recombination of multiple column outputs.

Although not explicitly shown in FIG. 1, it will be understood that the circuit 10 further includes conventional row decode, column decode, and read-write circuits known to those skilled in the art for use in connection with writing bits of the computational weight to, and reading bits of the computational weight from, the SRAM cells 14 of the memory array 12.

With reference now to FIG. 2, each memory cell 14 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. The word line driver circuit 16 is also typically coupled to receive the high supply voltage (Vdd) at the high supply node and is referenced to the low supply voltage (Gnd) at the low supply node.

The row controller circuit 18 performs the function of selecting which ones of the word lines WL<0> to WL<N−1> are to be simultaneously accessed (or actuated) in parallel during an in-memory compute operation, and further functions to control application of pulsed signals to the word lines in accordance with the feature data for that in-memory compute operation. FIG. 1 illustrates, by way of example only, the simultaneous actuation of all N word lines with the pulsed word line signals, it being understood that in-memory compute operations may instead utilize a simultaneous actuation of fewer than all rows of the SRAM array. The analog signal voltages which develop on a given pair of complementary bit lines BLT and BLC are dependent on the logic state of the bits of the computational weight stored in the memory cells 14 of the corresponding column and the width(s) of the pulsed word line signals generated from feature data and applied to those memory cells 14.

The implementation illustrated in FIG. 1 shows an example in the form of a pulse width modulation (PWM) for the applied word line signals for the in-memory compute operation. The use of PWM or period pulse modulation (PTM) for the applied word line signals is a common technique used for the in-memory compute operation based on the linearity of the vector for the multiply-accumulation (MAC) operation. The pulsed word line signal format can be further evolved as an encoded pulse train to manage block sparsity of the feature data of the in-memory compute operation. It is accordingly recognized that an arbitrary set of encoding schemes for the applied word line signals can be used when simultaneously driving multiple word lines. Furthermore, in a simpler implementation, it will be understood that all applied word line signals in the simultaneous actuation may instead have a same pulse width.

FIG. 3 is a timing diagram showing assertion (logic high) of a precharge control signal PCH which causes a bit line precharge circuit to charge the pair of complementary bit lines BLT and BLC to the Vdd voltage level, and then the deassertion (logic low) of the precharge control signal PCH followed by the simultaneous application of the pulse width modulated word line signals (dependent on the feature data) to plural rows of memory cells 14 in the SRAM array 12 for a given in-memory compute operation. Analog signal voltages Va,T and Va,C develop over time on the pair of complementary bit lines BLT and BLC, respectively, falling from the precharge voltage Vdd in response to the pulse width(s) of those word line signals and the logic state of the bits of the computational weight stored in the memory cells 14. The representation of the analog voltage Va levels as shown is just an example. After completion of the application of the pulse width modulated word line signals and a sampling of the analog voltages, the precharge control signal PCH is again asserted (logic high). It will be noted, however, that a risk exists that the analog voltage on at least one of the bit lines BLT and BLC may fall from the Vdd voltage to a level where an unwanted data flip occurs with respect to the stored data bit value in one of the memory cells 14 of the column. For example, a logic "1" state stored in the cell 14 of a column may be flipped to a logic "0" state. This data flip introduces a data error in the computational weight stored in the memory cells, thus jeopardizing the accuracy of subsequent in-memory compute operations.

The unwanted data flip that occurs due to an excess of bit line voltage lowering is mainly an effect of the simultaneous parallel access of the word lines in matrix vector multiplication mode during the in-memory compute operation. This problem is different from normal data flip of an SRAM bit cell due to Static-Noise-Margin (SNM) issues which happens in serial bit cell access when the bit line is close to the level of the supply voltage Vdd. During serial access, the normal data flip is instead caused by a ground bounce of the data storage nodes QT or QC of the accessed single bitcell.

A known solution to address the serial bit cell access SNM failure concern is to lower the word line voltage by small amount and this is generally achieved by a short circuit of the word line driver and the use of a bleeder path. Additionally, a known solution to address the foregoing problem is to apply a fixed word line voltage lowering (for example, to apply a voltage VWLUD equal to Vdd/2) on all integrated circuit process corners in order to secure the worst integrated circuit process corner. This word line underdrive (WLUD) solution, however, has a known drawback in that there is a corresponding reduction in read current on the bit lines which can have a negative impact on computation performance. Furthermore, the use of a fixed word line underdrive voltage can increase variability of the read current across the array leading to accuracy loss for the in-memory compute operation.

Another solution is to utilize a specialized bit cell circuit design for each memory cell 14 that is less likely to suffer from an unwanted data flip during simultaneous (parallel) access of multiple rows. A concern with this solution is an increase in occupied circuit area for such a bit cell circuit. It would be preferred for some in-memory computation circuit applications to retain the advantages provided by use of the standard 6T SRAM cell (FIG. 2) or 8T SRAM cell in the array 12.

There is accordingly a need in the art to support in-memory computation circuit use of a standard 6T SRAM cell while ensuring against unwanted data flip during simultaneous row access.

SUMMARY

In an embodiment, an in-memory computation circuit comprises: a memory array including a plurality of static random access memory (SRAM) cells arranged in a matrix with plural rows and plural columns, each row including a word line connected to the SRAM cells of the row, and each column including at least one bit line connected to the SRAM cells of the column; wherein each SRAM cell includes a first body bias voltage line connected to body nodes of first-type transistors of the SRAM; a word line drive circuit for each row having an output connected to drive the word line of the row; a row controller circuit configured to simultaneously actuate the plurality of word lines by applying pulses through the word line driver circuits to the word lines for an in-memory compute operation; a column processing circuit connected to the at least one bit line for each column and configured to process analog voltages developed on the bit lines in response to the simultaneous actuation of the plurality of word lines to generate a decision output for the in-memory compute operation; and a voltage generator circuit configured to generate a first modulated body bias voltage applied to the first body bias voltage line, said first modulated body bias voltage having a non-negative voltage level prior to the simultaneous actuation of the plurality of word lines for the in-memory compute operation, and said first modulated body bias voltage having a negative voltage level during the simultaneous actuation of the plurality of word lines for the in-memory compute operation.

In an embodiment, an in-memory computation circuit comprises: a memory array including a plurality of static random access memory (SRAM) cells arranged in a matrix with plural rows and plural columns, each row including a word line connected to the SRAM cells of the row, and each column including at least one bit line connected to the SRAM cells of the column; wherein each SRAM cell includes a first body bias voltage line connected to first body nodes of first-type transistors of the SRAM and a second body bias voltage line connected to second body nodes of second-type transistors of the SRAM; a word line drive circuit for each row having an output connected to drive the word line of the row; a row controller circuit configured to simultaneously actuate the plurality of word lines by applying pulses through the word line driver circuits to the word lines for an in-memory compute operation; a column processing circuit connected to the at least one bit line for each column and configured to process analog voltages developed on the bit lines in response to the simultaneous actuation of the plurality of word lines to generate a decision output for the in-memory compute operation; and a voltage generator circuit configured to generate a first modulated body bias voltage applied to the first body bias voltage line and generate a second modulated body bias voltage applied to the second body bias voltage line, wherein the voltage generator circuit switches the first modulated body bias voltage to a first negative voltage level during the simultaneous actuation of the plurality of word lines for the in-memory compute operation, and wherein the voltage generator circuit switches the second modulated body bias voltage to a second negative voltage level during the simultaneous actuation of the plurality of word lines for the in-memory compute operation.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
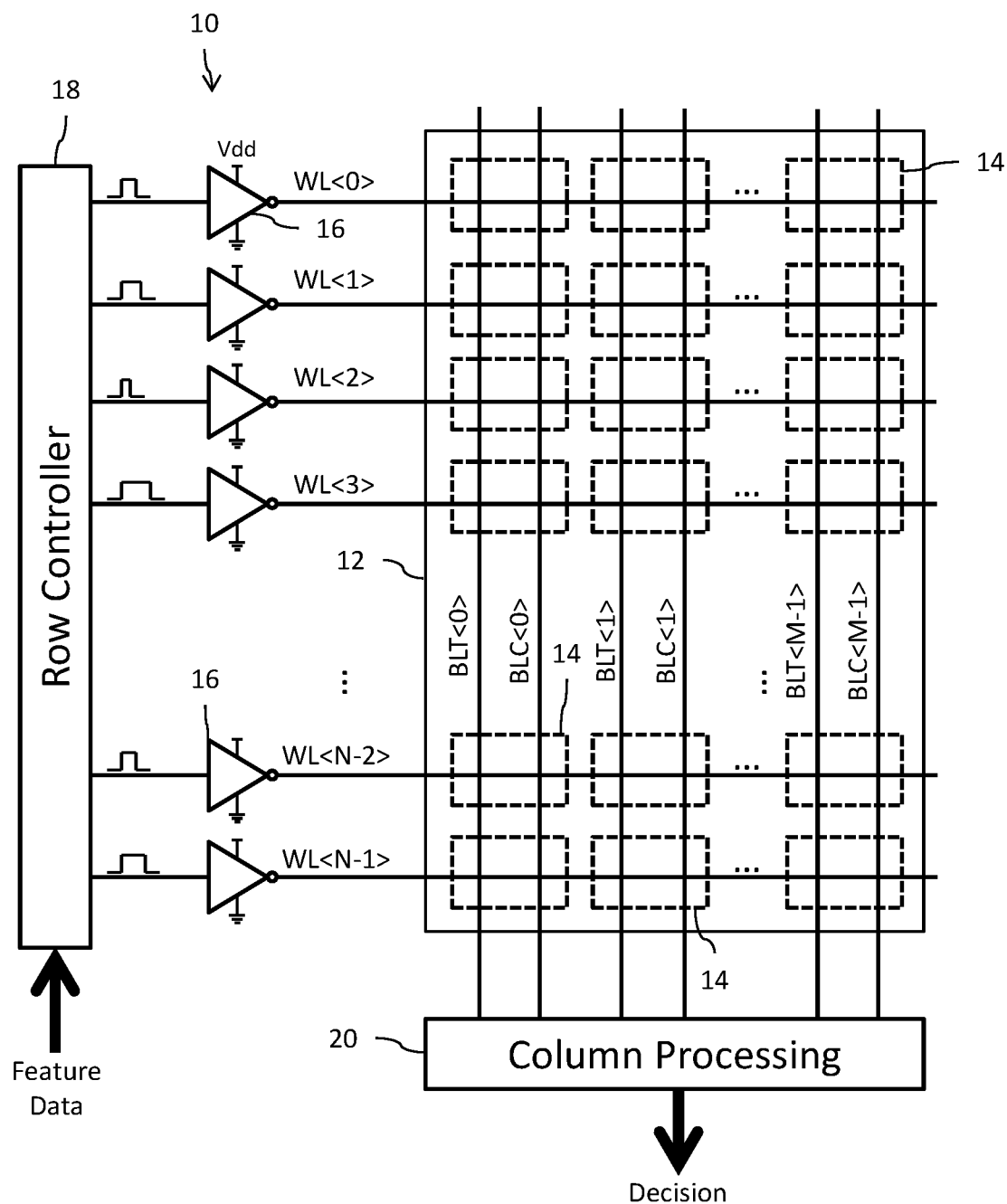
FIG. 1 is a schematic diagram of an in-memory computation circuit.
Figure 2:
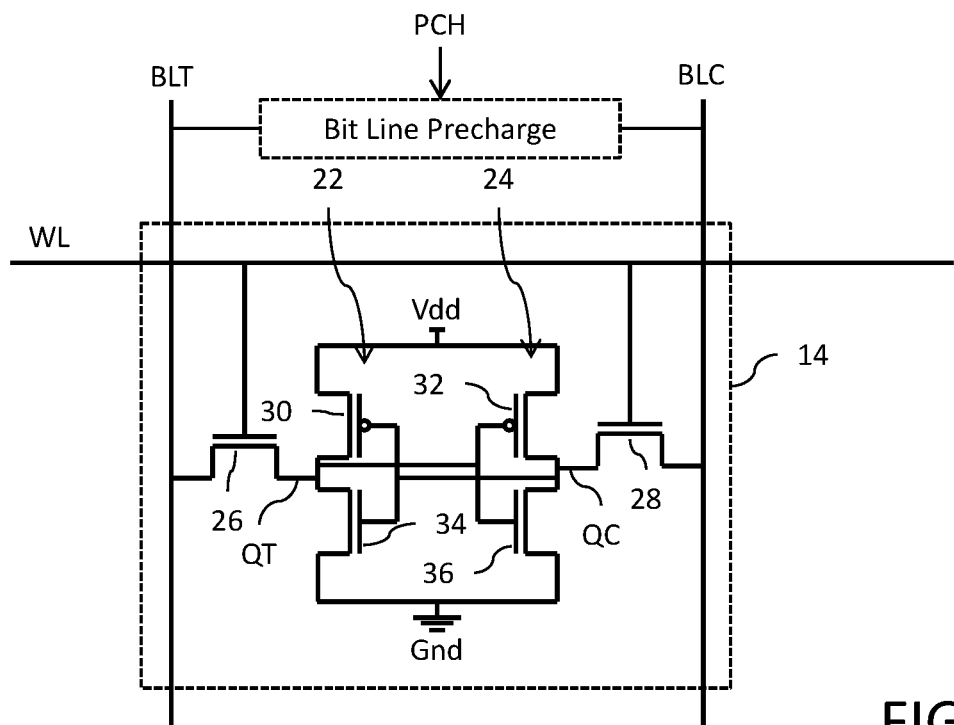
FIG. 2 is a circuit diagram of a standard 6T static random access memory (SRAM) cell as used the memory array of the in-memory computation circuit shown in FIG. 1.
Figure 3:
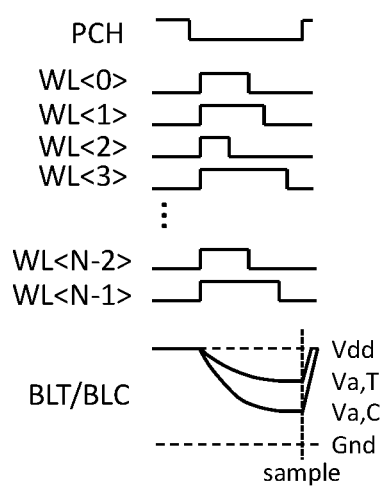
FIG. 3 is a timing diagram illustrating an in-memory compute operation for the circuit of FIG. 1.
Figure 4:
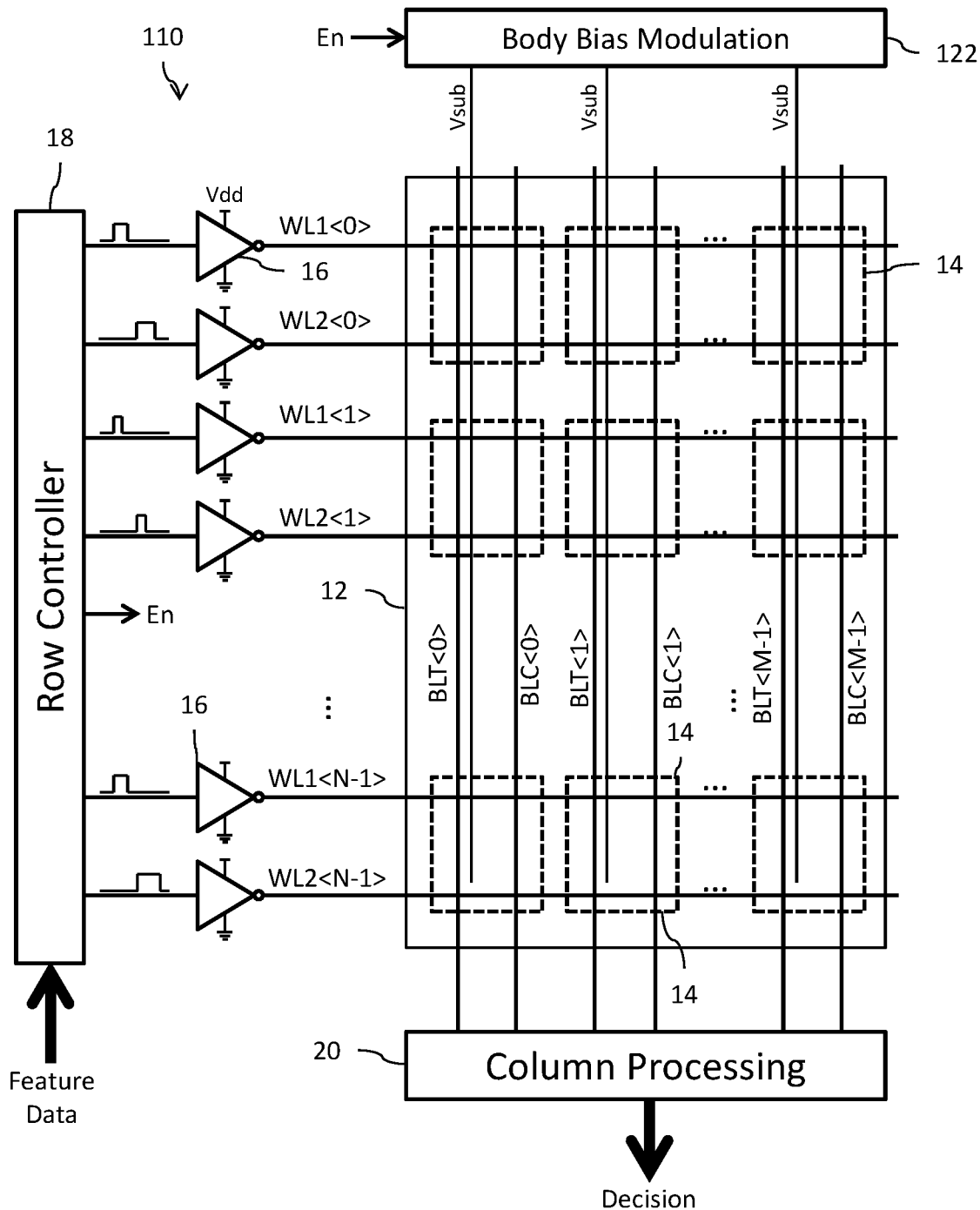
FIG. 4 is a circuit diagram for an embodiment of an in-memory computation circuit where a modulated body bias voltage is applied to the SRAM cells of the memory array.

Reference is now made to FIG. 4 which shows a circuit diagram for an embodiment of an in-memory computation circuit 110. Like references in FIGS. 1 and 4 refer to like or similar components, the description of which will not be repeated (see, description above). The circuit 110 differs from the circuit 10 in that a modulated body bias voltage Vsub is applied to the body nodes (i.e., substrates, back gates, wells, etc.) of the transistors of the SRAM cells of the memory array. A body bias modulation circuit 122 is provided to control the voltage level of the body bias voltage Vsub applied to the body nodes of the p-channel MOSFET devices and n-channel MOSFET devices of each SRAM cell 14 during the in-memory compute operation. In particular, during each memory compute operation, as indicated by assertion of the enable signal En, the body bias modulation circuit 122 lowers the body bias voltage Vsub from a default reference (for example, ground Gnd) level to a negative voltage level −Vneg. An effect of that application of the negative voltage is to strengthen the p-channel MOSFET devices and weaken the n-channel MOSFET devices. As a result, it is more difficult for falling analog bit line voltages Va,T or Va,C to induce an unwanted data flip of the stored data bit value in any of the memory cells 14. An additional benefit which accrues from the use of the negative voltage for body biasing during the in-memory compute operation is a reduction in the dissipation current of the n-channel MOSFET devices with a corresponding reduction in power consumption.

Figure 5:
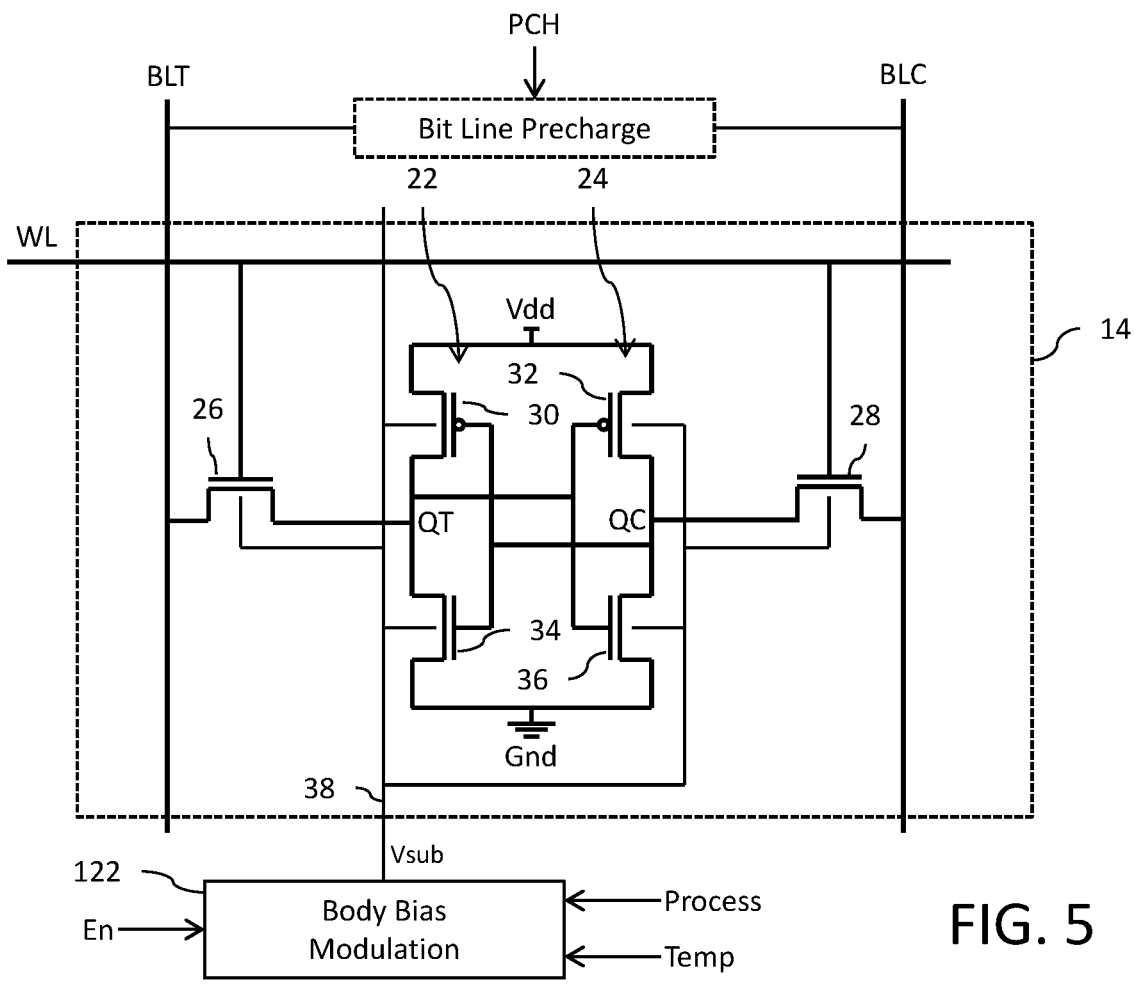
FIG. 5 is a circuit diagram of a 6T static random access memory (SRAM) cell as used in the memory array of the in-memory computation circuit shown in FIG. 4.

With reference now to FIG. 5, each memory cell 14 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The body nodes (i.e., the substrates, back gates, wells, etc.) of the transistors 26 and 28 are coupled to a body bias voltage line 38 which receives the modulated body bias voltage Vsub from the body bias modulation circuit 122. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. The body nodes of the transistors 30, 32, 34 and 36 are also coupled to receive the modulated body bias voltage Vsub from the body bias voltage line 38. While FIG. 5 is specific to the use of a 6T-type SRAM cell, those skilled in the art recognize that any bit cell with a similar topology and/or functionality and which supports body biasing control could instead be used.

In an example embodiment, the level of the negative voltage −Vneg applied by the body bias modulation circuit 122 as the body bias voltage Vsub is fixed at a nominal voltage level selected based on typical process and/or temperature conditions. Alternatively, the nominal voltage level the negative voltage −Vneg can be selected based on worst case process and/or temperature conditions. In a further alternative embodiment, the body bias modulation circuit 122 is configured to select a level of the negative voltage −Vneg through a tuning operation that is dependent on integrated circuit process and/or temperature information. For example, in response to process information (Process) received by the body bias modulation circuit 122, a positive or negative adjustment of the level of the negative voltage −Vneg from the nominal voltage level can be made to ensure optimal performance in inhibiting against unwanted data flip given the applicable process corner. As an example, consider the case where the process information indicates that the p-channel transistors 30 and 32 are fast and/or the n-channel transistors 34 and 36 are slow. In response to this process information, the body bias modulation circuit 122 may make an adjustment in the level of the negative voltage −Vneg to be less negative than the nominal negative voltage level. Similarly, in response to temperature information (Temp) received by the body bias modulation circuit 122, a positive or negative adjustment of the level of the negative voltage −Vneg from the nominal voltage level can be made to ensure optimal performance in inhibiting against unwanted data flip given the applicable temperature conditions. As an example, consider the specific case where the temperature information indicates that the integrated circuit temperature is decreasing. In response to this temperature information, the body bias modulation circuit 122 may make an adjustment in the level of the negative voltage −Vneg to be more negative than the nominal negative voltage level in order to increase the strength of the pull-up n-channel transistor in the bit cell.

Figure 6:
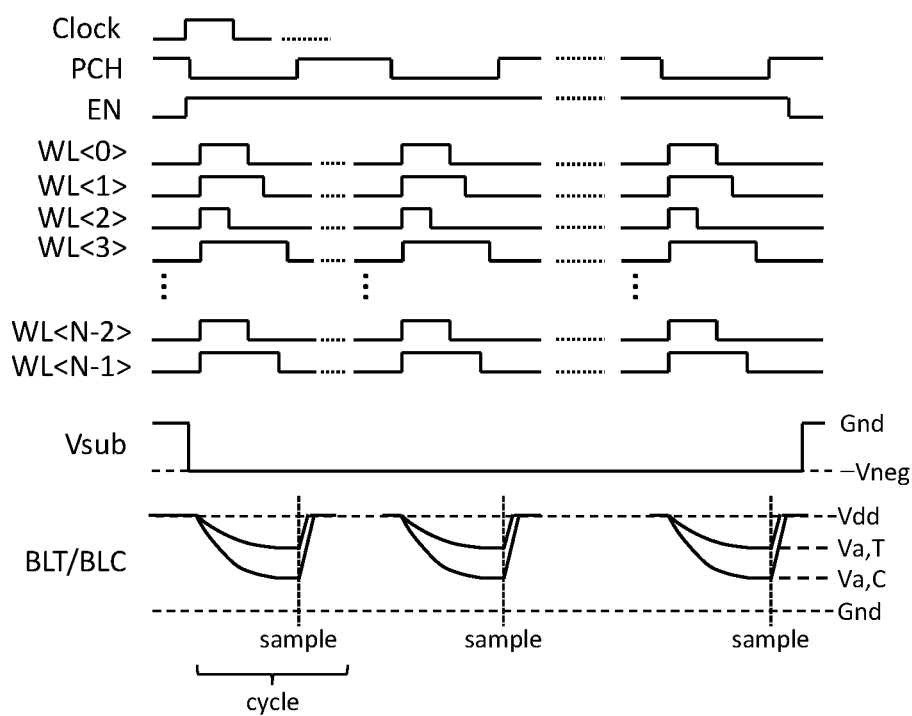
FIG. 6 is a timing diagram illustrating an in-memory compute operation for the circuit of FIG. 4.

FIG. 6 is a timing diagram showing that the enable signal En is deasserted, and the body bias modulation circuit 122 generates the body bias voltage Vsub at a default reference voltage level (shown by example only here to be the ground Gnd voltage level). The precharge control signal PCH is also asserted (logic high) at this time which causes a bit line precharge circuit to charge the pair of complementary bit lines BLT and BLC to the Vdd voltage level. At the beginning of the compute mode for the in-memory compute operation, the enable signal En is asserted and the body bias modulation circuit 122 changes the body bias voltage Vsub to the negative voltage −Vneg level (set at the nominal level or further modulated/tuned in response to process and/or temperature information). It is important to recognize that this negative voltage −Vneg is being applied to all memory cells 14, for example to multiple cells in each column of the memory array, which are participating in performance of a given in-memory compute operation. One or more individual compute cycles may be executed in connection with each in-memory compute operation. FIG. 6 shows an example where multiple compute cycles are being executed. For each compute cycle, the precharge control signal PCH is deasserted (logic low). This is followed by the simultaneous application of the pulse width modulated word line signals dependent on the feature data to plural rows of memory cells 14 in the SRAM array 12 for that in-memory compute operation. Analog signal voltages Va,T and Va,C develop over time on the pair of complementary bit lines BLT and BLC, respectively, falling from the precharge voltage Vdd in response to the pulse width(s) of those word line signals and the logic state of the bits of the computational weight stored in the memory cells 14. The representation of the analog voltage Va levels as shown is just an example. After completion of the application of the pulse width modulated word line signals and a sampling of the analog voltages, the precharge control signal PCH is asserted (logic high) and the compute cycle ends (to be followed, if needed, by a next compute cycle).

The enable signal En remains asserted for the duration of the in-memory compute operation (i.e., the body bias modulation circuit 122 holds the body bias voltage Vsub at the negative voltage −Vneg level over the course of multiple compute cycles). At the end of the in-memory compute operation, the enable signal En is deasserted and the body bias modulation circuit 122 returns the body bias voltage Vsub to the default (for example, ground Gnd) voltage level.

As previously noted, the circuit 10, 110 further includes conventional row decode, column decode, and read-write circuits for use in connection with writing bits of the computational weight to, and reading bits of the computational weight from, the SRAM cells 14 of the memory array 12. Because the negative voltage −Vneg level for the body bias voltage Vsub can have an adverse impact on the normal write and read operations for the SRAM cells 14, generation of the enable signal En is controlled to be deasserted during normal memory read/write so that the body bias voltage Vsub is set at the default (for example, ground Gnd) voltage level.

Figure 7:
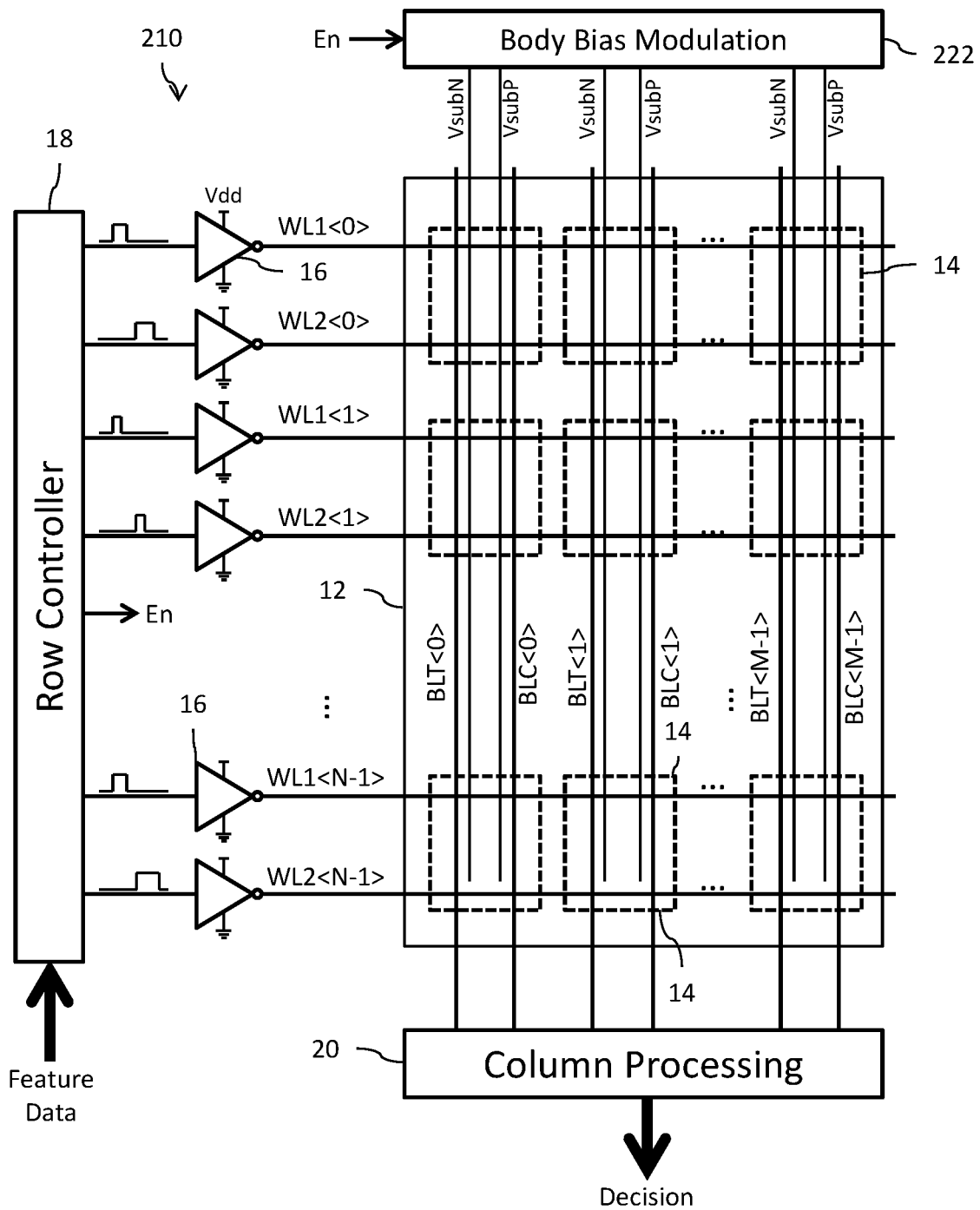
FIG. 7 is a circuit diagram for an embodiment of an in-memory computation circuit where modulated body bias voltages are applied to the SRAM cells of the memory array.

Reference is now made to FIG. 7 which shows a circuit diagram for an embodiment of an in-memory computation circuit 210. Like references in FIGS. 4 and 7 refer to like or similar components, the description of which will not be repeated (see, description above). The circuit 210 differs from the circuit 110 in that a first modulated body bias voltage VsubN is applied to the body nodes of the n-channel MOSFET devices of the SRAM cells of the memory array and a second modulated body bias voltage VsubP is applied to the body nodes of the p-channel MOSFET devices of the SRAM cells of the memory array. Thus, the circuit 210 supports the use of independent body bias modulation for n-type and p-type transistors during in memory compute operations. A body bias modulation circuit 222 is provided to control the voltage level of the body bias voltages VsubN, VsubP applied to the body nodes (i.e., the substrates, back gates, wells, etc.) of the n-channel MOSFET devices and p-channel MOSFET devices, respectively, of each SRAM cell 14 during the in-memory compute operation. In particular, during each memory compute operation, as indicated by assertion of the enable signal En, the body bias modulation circuit 222 lowers the body bias voltages VsubN, VsubP from the default reference (for example, ground Gnd) voltage level to a negative voltage level −VnegN, −VnegP, respectively.

Figure 8:
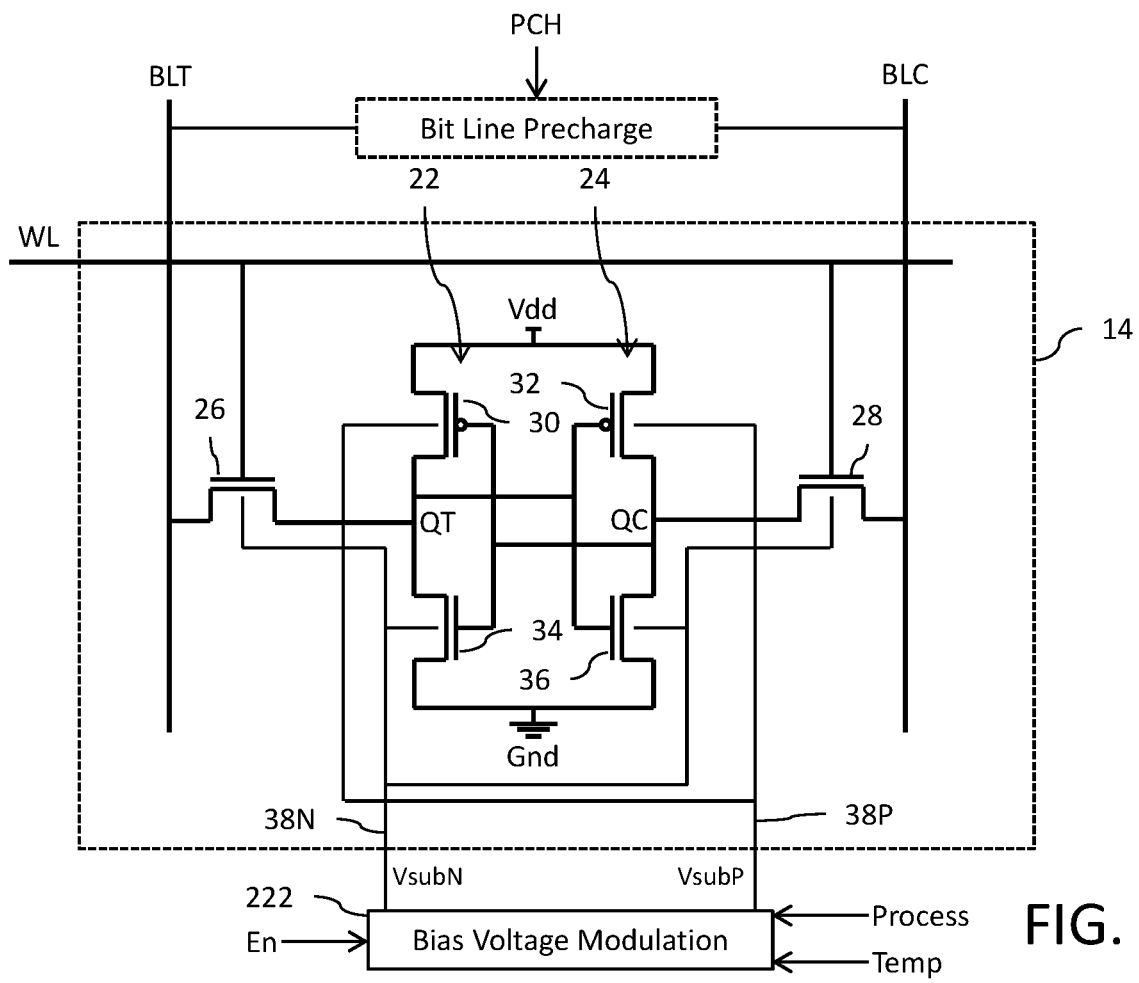
FIG. 8 is a circuit diagram of a 6T static random access memory (SRAM) cell as used in the memory array of the in-memory computation circuit shown in FIG. 7.

With reference now to FIG. 8, each memory cell 14 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two n-channel transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The body nodes (i.e., the substrates, back gates, wells, etc.) of the n-channel transistors 26 and 28 are coupled to a first body bias voltage line 38N which receives the modulated body bias voltage VsubN from the body bias modulation circuit 222. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. The body nodes of the p-channel transistors 30 and 32 are coupled to a second body bias voltage line 38P which receives the modulated body bias voltage VsubP from the body bias modulation circuit 222. The body nodes (of the n-channel transistors 34 and 36 are also coupled to receive the modulated body bias voltage VsubN from the body bias voltage line 38N. While FIG. 8 is specific to the 6T-type SRAM cell, those skilled in the art recognize that any bit cell with a similar topology and/or functionality could instead be used.

In an example embodiment, the levels of the negative voltages −VnegN, −VnegP applied by the body bias modulation circuit 222 are fixed at nominal voltage levels selected based on typical process and/or temperature conditions. Alternatively, the nominal voltage levels can be selected based on worst case process and/or temperature conditions. In an alternative embodiment, the body bias modulation circuit 222 is configured to select levels of the negative voltages −VnegN, −VnegP in dependence on integrated circuit process and/or temperature information. For example, in response to process information (Process) received by the body bias modulation circuit 222, a positive or negative adjustment of the level of the negative voltages −VnegN, −VnegP from the nominal voltage levels can be made to ensure optimal performance in inhibiting against unwanted data flip given the applicable process corner. As an example, consider the case where the process information indicates that the MOSFET devices of the memory cells 12 are at the slow-fast (where NMOS speed is slow and PMOS speed is fast) process corner. In response to this process information, the body bias modulation circuit 222 may make an adjustment in the level of the negative voltage −VnegN to be less negative than its nominal negative voltage level and make an adjustment in the level of the negative voltage −VnegP to be much less negative than its nominal negative voltage level. Similarly, in response to temperature information (Temp) received by the body bias modulation circuit 222, a positive or negative adjustment of the levels of the negative voltages −VnegN, −VnegP from the respective nominal voltage levels can be made to ensure optimal performance in inhibiting against unwanted data flip given the applicable temperature conditions. As an example, consider the specific case where the temperature information indicates that the integrated circuit temperature is decreasing. In response to this temperature information, the body bias modulation circuit 222 may make an adjustment in the levels of the negative voltages −VnegN, −VnegP to be more negative than the respective nominal negative voltage levels in order to increase the strength of the pull-up p-channel transistors.

Figure 9:
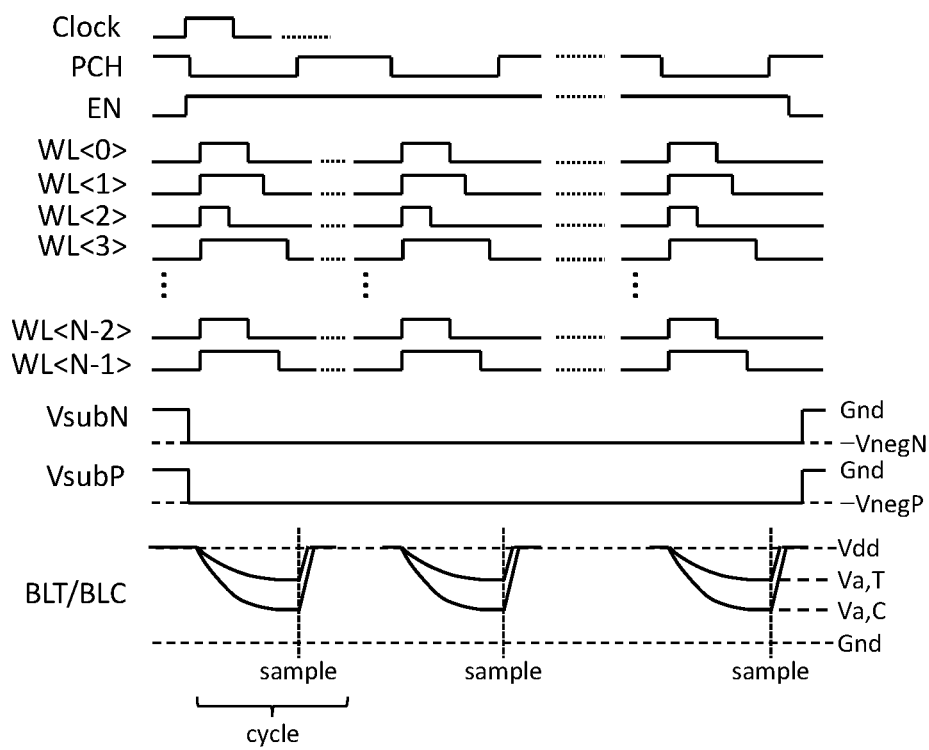
FIG. 9 is a timing diagram illustrating an in-memory compute operation for the circuit of FIG. 4.

FIG. 9 is a timing diagram showing that the enable signal En is deasserted, and the body bias modulation circuit 222 generates the body bias voltages VsubN, VsubP at a default reference voltage level (shown by example only here to be the ground Gnd voltage level). The precharge control signal PCH is also asserted (logic high) at this time which causes a bit line precharge circuit to charge the pair of complementary bit lines BLT and BLC to the Vdd voltage level. At the beginning of the compute mode for the in-memory compute operation, the enable signal En is asserted and the body bias modulation circuit 222 changes the body bias voltages VsubN, VsubP to the negative voltage −VnegN, −VnegP levels (set at the nominal levels or further modulated in response to process and/or temperature information). It is important to recognize that the negative voltages −VnegN, −VnegP are being applied to all memory cells 14, for example to multiple cells in each column of the memory array, which are participating in performance of a given in-memory compute operation. One or more compute cycles may be executed in connection with each in-memory compute operation. FIG. 9 shows an example where multiple compute cycles are being executed. For each compute cycle, the precharge control signal PCH is deasserted (logic low). This is followed by the simultaneous application of the pulse width modulated word line signals to plural rows of memory cells 14 in the SRAM array 12 for that in-memory compute operation. Analog signal voltages Va,T and Va,C develop over time on the pair of complementary bit lines BLT and BLC, respectively, falling from the precharge voltage Vdd in response to the pulse width(s) of those word line signals and the logic state of the bits of the computational weight or feature data stored in the memory cells 14. The representation of the analog voltage Va levels as shown is just an example. After completion of the application of the pulse width modulated word line signals and a sampling of the analog voltages, the precharge control signal PCH is asserted (logic high) and the compute cycle ends. A next compute cycle, if needed, may immediately follow.

The enable signal En remains asserted for the duration of the in-memory compute operation (i.e., the body bias modulation circuit 122 holds the body bias voltages VsubN, VsubP to the negative voltage −VnegN, −VnegP levels over the course of multiple compute cycles). At the end of the in-memory compute operation, the enable signal En is deasserted and the body bias modulation circuit 122 returns the body bias voltage Vsub to the default (for example, ground Gnd) voltage level.

As previously noted, the circuit 10, 110, 210 further includes conventional row decode, column decode, and read-write circuits for use in connection with writing bits of the computational weight to, and reading bits of the computational weight from, the SRAM cells 14 of the memory array 12. Because the negative voltage −VnegN, −VnegP levels for the body bias voltages VsubN, VsubP, respectively, can have an adverse impact on the normal write and read operations for the SRAM cells 14, the enable signal En is deasserted during memory read/write so that the body bias voltages VsubN, VsubP are set at the default (for example, ground Gnd) voltage level.

Figure 10A:
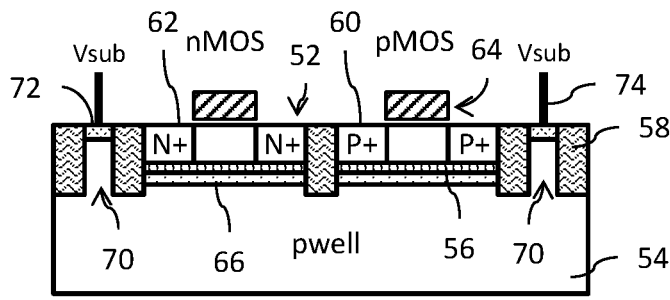
FIGS. 10A and 10B illustrate cross-sections of an integrated circuit including a p-channel MOSFET transistor and an n-channel MOSFET transistor which support modulated body biasing.
Figure 10B:
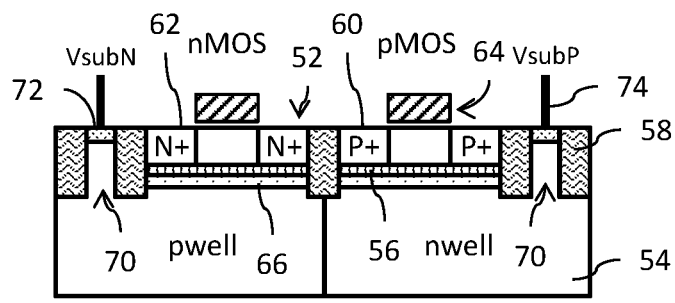

The p-channel and n-channel MOSFET transistors of the memory cells 14 can be implemented in any suitable technology which supports modulation of the body bias voltage. FIGS. 10A and 10B illustrate cross-sections of an integrated circuit including a p-channel MOSFET (pMOS) transistor and an n-channel MOSFET (nMOS) transistor implemented using fully-depleted silicon on insulator (FD-SOI) technology. Specifically, FIG. 10A shows a single well implementation in FD-SOI useful for the circuit implementation shown in FIG. 5 and FIG. 10B shows a dual well implementation in FD-SOI useful for the circuit implementation shown in FIG. 8. An SOI substrate 50 includes a fully depleted semiconductor film layer 52 that is insulated from a semiconductor support 54 by an insulating layer 56 (often referred to in the art as a buried oxide (BOX) layer). Shallow trench isolations 58 delimit active areas of the semiconductor film layer 52 where the pMOS) and nMOS transistors are fabricated. The pMOS transistor includes p-type doped source and drain regions 60 in the active area, while the nMOS transistor includes n-type doped source and drain regions 62 in the active area. A gate structure 64 is formed over the channel region of the active area in semiconductor film layer 52 between the source and drain regions. The body nodes (for example, substrates, back gates, wells) of the pMOS and nMOS transistors are formed by the portions of the semiconductor support 54 and buried doped regions 66 (doped with a same conductivity type as the well in which they are located) located underneath each transistor. In particular, for the embodiment of FIG. 10A, a single (p-type doped) well (pwell) for the body nodes is formed by the semiconductor support 54 extending under both the pMOS transistor and the nMOS transistor. For the embodiment of FIG. 10B, however, a dual well configuration is provided with an n-type well (nwell) for the pMOS body nodes formed in the semiconductor support 54 and extending under the pMOS transistor and a p-type well (pwell) for the nMOS body nodes formed in the semiconductor support 54 and extending under the nMOS transistor. The shallow trench isolations 56 further delimit sinker regions 70 for accessing the wells. Each sinker region 70 includes a heavily doped contact region 72 (p-type doped for the p-type wells and n-type doped for the n-type wells). An electrical contact 74 is made to each contact region 72 in order to support voltage biasing of the body nodes provided by the wells (with the negative voltage −Vneg in FIG. 10A and with the negative voltages −VnegN, −VnegP in FIG. 10B). It will be noted that the illustrations for FD-SOI implementation in FIGS. 10A and 10B are just examples, and that different nwell/pwell combinations with n+/p+ implants can be chosen depending on process/technology. The design and fabrication of MOS transistor in FD-SOI technology is well known in the art.

Figure 11A:
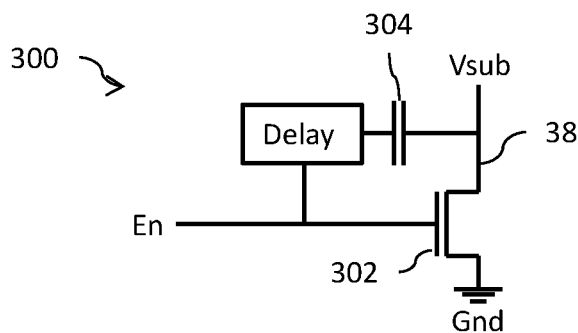
FIGS. 11A, 11B and 11C are circuit diagrams for embodiments of a circuit for providing modulated body bias voltages.

Reference is now made to FIG. 11A which shows a circuit diagram for an embodiment of a circuit 300 within the bias voltage modulation circuit 122 for providing the modulated body bias voltage Vsub. The circuit 300 includes an n-channel MOSFET device 302 having a source coupled (preferably directly connected) to a default reference (for example, ground Gnd) node and a drain coupled (preferably directly connected) to the body bias voltage line 38. A gate of the transistor 302 is coupled to receive the enable signal En. More specifically, the enable signal En is fed through a delay circuit before being applied to the gate of transistor 302 in order to avoid overlap between the gate being driven low and Vsub going negative. A capacitor 304 has a first terminal coupled (preferably directly connected) to the gate of transistor 302 and a second terminal coupled (preferably directly connected) to the body bias voltage line 38.

The circuit 300 operates as follows. When the enable signal En is deasserted (logic high), transistor 302 is turned on and a voltage approximately equal to the logic high voltage of enable signal En is stored across the capacitor 304. Furthermore, because transistor 302 is turned on, the voltage Vsub at the body bias voltage line 38 at this time is maintained at the default (for example, ground Gnd) reference voltage. When the enable signal En is asserted (logic low), the voltage Vsub at the body bias voltage line 38 is boosted to the negative voltage level −Vneg through the voltage stored on the capacitor 304.

Figure 11B:
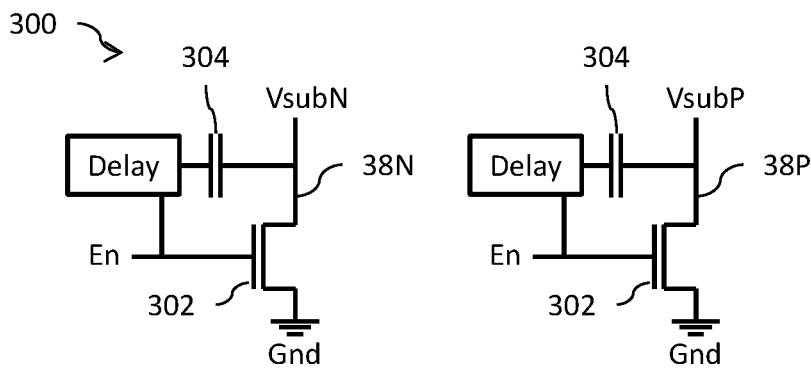

In an embodiment as shown in FIG. 11B, a pair of circuits like that shown in FIG. 11A could be used for the bias voltage modulation circuit 222 to provide the negative voltages −VnegN, −VnegP for application to the body bias voltage lines 38N, 38P, respectively, in response to the enable signal En. Again, the enable signal En is fed to the gates of the transistors 302 through a suitable delay circuit.

Figure 11C:
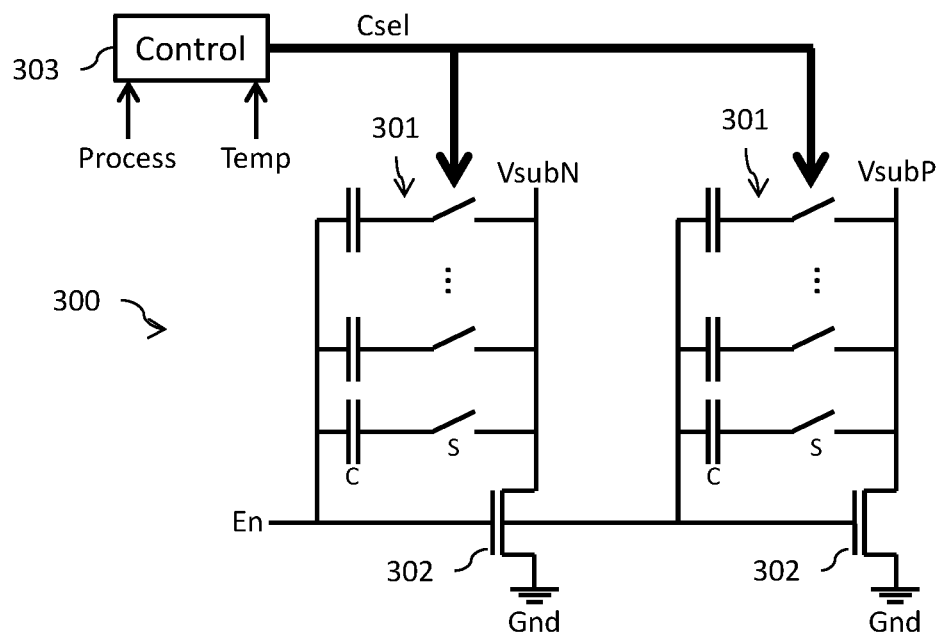

FIG. 11C shows an alternative implementation for the circuit 300 within the bias voltage modulation circuit 222 to provide the negative voltages −VnegN, −VnegP for VsubN and VsubP, respectively. The circuit 300 includes two n-channel MOSFET devices 302 each having a source coupled (preferably directly connected) to the default (for example, ground Gnd) reference node and with the drain of one transistor coupled (preferably directly connected) to the body bias voltage line 38N and the drain of the other transistor coupled (preferably directly connected) to the body bias voltage line 38P. The gates of the transistors 302 are coupled to receive the enable signal En.

The negative voltage boosting circuitry of circuit 300 is formed by a plurality of switched capacitor circuits 301 connected in parallel with each other and coupled between a node receiving the delayed enable signal EN and the body bias voltage line 38N and body bias voltage line 38P, respectively. Each switched capacitor circuit 301 includes a capacitor C connected in series with a switch S (which may be implemented by a transistor device). A digital control circuit 303 generates a multi-bit digital control signal Csel that selectively actuates one or more of the switches S of the switched capacitor circuits 301 in connection the generation and selective application of the negative voltages −VnegN, −VnegP.

The circuit 300 operates as follows. When the enable signal En is deasserted (logic high), transistor 302 is turned on and the default (for example, ground Gnd) voltage is applied to body bias voltage line 38N and body bias voltage line 38P. The digital control circuit 303 controls all switches S of the switched capacitor circuits 301 to be closed. When the enable signal EN is asserted (logic low) for the in-memory compute operation, however, the digital control circuit 303 selectively deactuates the switches S of the switched capacitor circuits 301 to support modulation of the level of the negative voltages −VnegN, −VnegP.

The selective deactuation of the switches S provides flexibility for modulating the level of the negative voltages. This provides opportunity to program the negative voltage levels in response to process and/or temperature condition. With respect to the modulation of the level of the negative voltages −VnegN, −VnegP dependent on integrated circuit process information, the digital control circuit 303 can be supplied with process data concerning whether the MOSFET devices of the memory cells 12 are at a certain process corner and in response thereto the digital control circuit 303 can assert bits of the multi-bit digital control signal Csel so as to control the selection of switched capacitor circuits 301 to tune the negative voltage levels for optimal performance. Similarly, with respect to the modulation of the negative voltages −VnegN, −VnegP dependent on integrated circuit temperature information, the digital control circuit 340 can be supplied with data concerning current temperature conditions and in response thereto the digital control circuit 303 can assert bits of the multi-bit digital control signal Csel so as to control the selection of switched capacitor circuits 301 to tune the negative voltage levels for optimal performance.

Figure 12A:
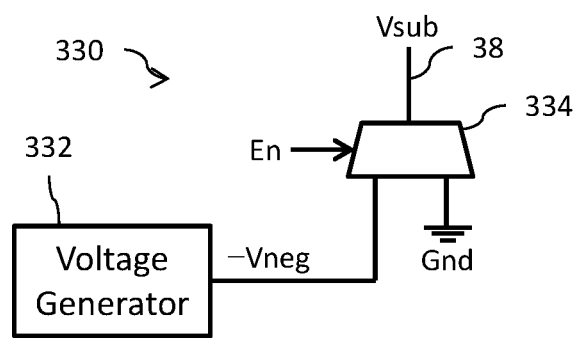
FIGS. 12A and 12B are circuit diagrams for embodiments of a circuit for providing modulated body bias voltages.

Reference is now made to FIG. 12A which shows a circuit diagram for an embodiment of a circuit 330 within the body bias modulation circuit 122 for providing the modulated body bias voltage Vsub. The circuit 330 includes a voltage generator circuit 332 configured to generate the negative body bias voltage −Vneg. The voltage generator circuit 332 may, for example, comprise a voltage regulator circuit (such as a low drop-out (LDO) regulator) that generates the negative body bias voltage −Vneg from an input voltage. Alternatively, the voltage generator circuit 332 may, for example, comprise a charge pump circuit that generates the negative body bias voltage −Vneg from the supply voltage Vdd.

A switching circuit 334, illustrated here by example only as an analog multiplexing circuit, has a first input configured to receive the negative body bias voltage −Vneg output from the voltage generator circuit 332 and the second input configured to receive the default (for example, ground Gnd) reference voltage. An output of the switching circuit 334 is coupled (preferably directly connected) to the body bias voltage line 38. The selection operation performed by the switching circuit 334 is controlled by the enable signal En. When the enable signal En is deasserted, the switching circuit 334 applies the default (ground Gnd) reference voltage as the modulated body bias voltage Vsub. Conversely, when the enable signal En is asserted, the switching circuit 334 applies the negative voltage −Vneg generated by the voltage generator circuit 332 as the body bias voltage Vsub.

Figure 12B:
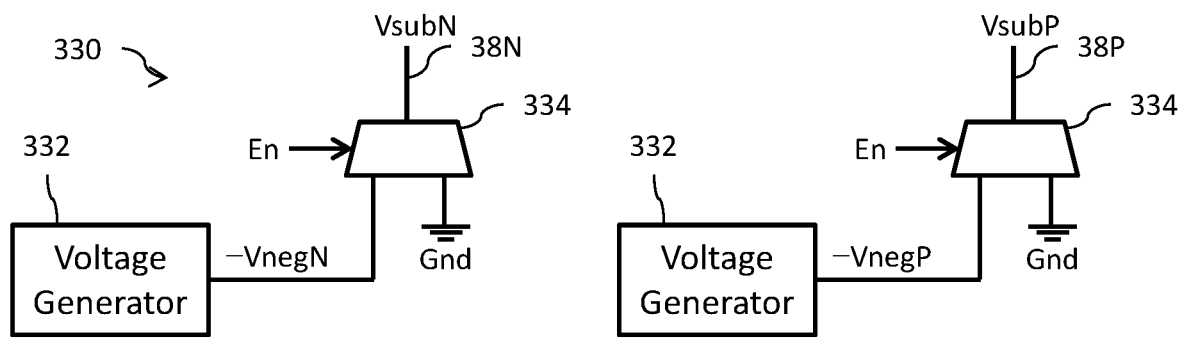

In an embodiment as shown in FIG. 12B, a pair of circuits like that shown in FIG. 12A could be used for the bias voltage modulation circuit 222 to provide the negative voltages −VnegN, −VnegP for application to the body bias voltage lines 38N, 38P, respectively, in response to the enable signal En.

Figure 13A:
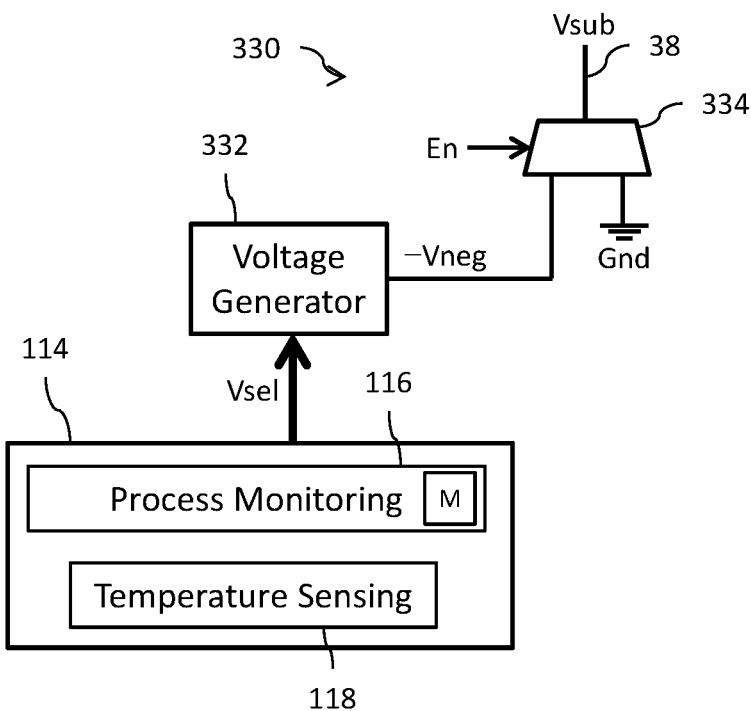
FIGS. 13A and 13B are circuit diagrams for embodiments of a circuit for providing modulated body bias voltages.

Reference is now made to FIG. 13A, which shows a circuit diagram for an embodiment of a circuit 430 within the body bias modulation circuit 122 for providing the modulated body bias voltage Vsub. Like references in FIGS. 12A and 13A refer to like or similar components, the description of which will not be repeated (see, description above). The circuit 430 differs from the circuit 330 in that the level of negative body bias voltage −Vneg is not fixed (for example, to a nominal or typical level), but is instead modulated dependent on integrated circuit process and/or temperature conditions.

The voltage generator circuit 332 receives a control signal. In an embodiment, the control signal is a multi-bit digital control signal Vsel, but it will be understood that the control signal can instead be implemented as an analog signal. The value of the control signal (in particular, the digital values of the bits of the control signal Vsel) selects the voltage level of the negative body bias voltage −Vneg output by the voltage generator circuit 332. The control signal Vsel is generated by a control circuit 114 in response to integrated circuit process and/or temperature information, and thus the voltage level of the negative body bias voltage −Vneg is modulated in a manner which is dependent on that integrated circuit process and/or temperature information.

The integrated circuit process information is provided in a digital code generated and stored in a memory M within the control circuit 114. The digital code represents the centering of the process lot and is generated by circuitry such as, for example, ring oscillators (RO) whose output frequency varies dependent on integrated circuit process. The output frequencies of the RO circuits thus represent the process centering and can easily be converted into a digital code (for example, through the use of counter circuits). A process monitoring circuit 116 within the control circuit 114 can generate the value of the control signal Vsel as a function of the stored digital code for the integrated circuit process. For example, the process monitoring circuit 116 may include a look-up table (LUT) that correlates each digital code with a value of the control signal Vsel for providing a specific voltage level of the negative body bias voltage −Vneg that will produce an optimal level of protection against unwanted data flip for the integrated circuit process corner. The control circuit 114 outputs the value of the control signal Vsel correlated to the stored digital code and the voltage generator circuit 112 responds by generating the corresponding level for the negative body bias voltage −Vneg.

The temperature information is generated by a temperature sensing circuit 118 and represents a current temperature of the integrated circuit. The temperature sensing circuit 118 may select, modify or adjust the value of the control signal Vsel as a function of the sensed temperature. For example, the temperature sensing circuit 118 may include a look-up table (LUT) that specifies a certain (positive or negative) adjustment in the value of the control signal Vsel for providing a corresponding tuning of the specific voltage level of the negative body bias voltage −Vneg that will produce the optimal level of protection against unwanted data flip given the integrated circuit process corner and current temperature condition.

Figure 13B:
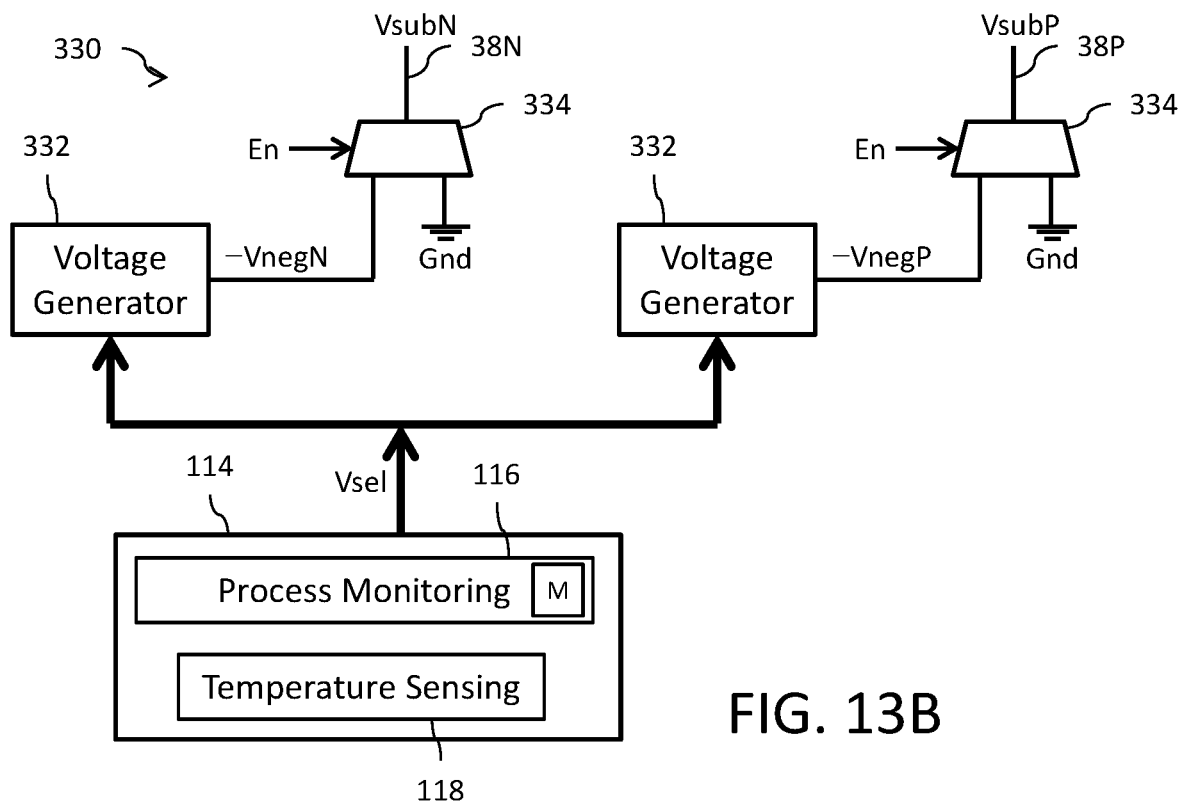

FIG. 13B shows an implementation of the circuit 430 within the body bias modulation circuit 222 for generating the negative voltages −VnegN, −VnegP, where the level of the voltages is modulated dependent on integrated circuit process and/or temperature conditions. The value of the control signal selects the voltage levels of the negative body bias voltages −VnegN, −VnegP output by the voltage generator circuit 332.

Figure 14:
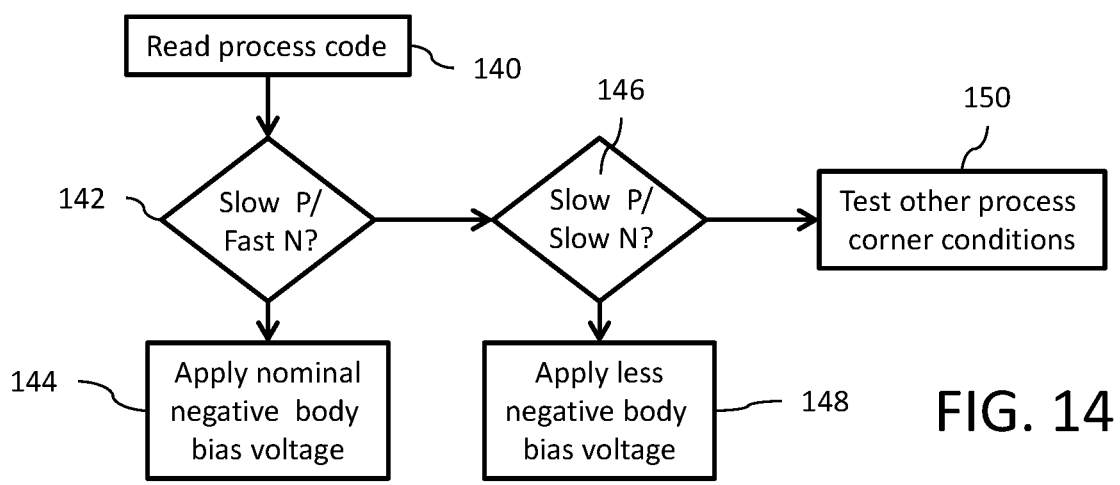
FIG. 14 is a flow diagram.

Reference is now made to FIG. 14 which shows a flow diagram for operation of the control circuit 114 and process monitoring circuit 116 for the circuits of FIGS. 13A and 13B. In step 140, the stored digital code for the integrated circuit process is read from the memory M. In an embodiment, the digital code for the integrated circuit process is loaded at the factory into the memory M, and this digital code is based on the identified integrated circuit process characteristic (process corner, etc.) for the integrated circuit fabrication lot (for example, the source wafer) from which the integrated circuit is obtained. Next, in step 142, a determination is made as to whether the read digital code for the integrated circuit process indicates that the MOSFET devices of the memory cells 12 are at the (worst case) slow p-channel, fast n-channel integrated circuit process corner. If yes, then a value of the control signal Vsel is selected in step 144 which corresponds to the read digital code and which will cause the voltage generator circuit 332 to generate nominal negative levels for the body bias voltage Vsub (or VsubN, VsubP). If no in step 142, then in step 146 a determination is made as to whether the read digital code for the integrated circuit process indicates that the MOSFET devices of the memory cells 12 are at the slow p-channel, slow n-channel integrated circuit process corner. If yes, then a value of the control signal Vsel is selected in step 148 which corresponds to the read digital code and which will cause the voltage generator circuit 332 to generate less negative levels for the body bias voltage Vsub (or VsubN, VsubP). If no in step 146, then in step 150 other process corner conditions can be tested and corresponding modulation of the negative levels for the body bias voltage Vsub (or VsubN, VsubP) can be made.

Although the process of FIG. 14 illustrates a limited evaluation of the digital code for the integrated circuit process, it will be understood that the evaluation process can be significantly more complex in terms of modulating the body bias voltage Vsub (or VsubN, VsubP) to evaluate multiple process corners. Additional testing steps may be added to the process of FIG. 14 to test for other integrated circuit process corner or process-related conditions, with each test having an associated digital code and value of the control signal Vsel for setting a corresponding negative voltage level of the body bias voltages VsubN, VsubP generated by the voltage generator circuits 332. For example, consider the following table:

| nMOS | pMOS | VsubP | VsubN |
|---|---|---|---|
| Slow | Slow | <−VnegP | <−VnegN |
| Fast | Slow | −VnegP | −VnegN |
| Slow | Fast | <<−VnegP | <−VnegN |
| Fast | Fast | <−VnegP | <=−VnegN |

In the example illustrated by the foregoing table, the nominal negative voltages −VnegN, −VnegP are set to provide optimal protection against unwanted data flip based on the worst case process corner (i.e., where and NMOS speed is fast and PMOS speed is slow—the "FS" corner). The digital code for the integrated circuit process that is saved in the memory M will specify the identified integrated circuit process characteristic (e.g., slow/slow, fast/slow, slow/fast, fast/fast corner). The control circuit 114 and process monitoring circuit 116 operate to determine which corner is specified by the digital code. In the event that the digital code specifies the "FS" corner, then the nominal negative body bias voltages −VnegN, −VnegP are generated by the voltage generator circuits 332. If the digital code specifies the "SS" corner, then the voltage generator circuits 332 will generate the body bias voltages VsubN and VsubP to be less negative (i.e., smaller in magnitude; perhaps even at ground or being positive) than the nominal negative body bias voltages −VnegN, −VnegP. If the digital code specifies the "SF" corner, then the voltage generator circuit 332 will generate the body bias voltage VsubN to be less negative (perhaps even at ground or being positive) than the nominal negative body bias voltage −VnegN, and the voltage generator circuit 332 will generate the body bias voltage VsubP to be much less negative (perhaps even at ground or being positive) than the nominal negative body bias voltage −VnegP. Lastly, if the digital code specifies the "FF" corner, then the voltage generator circuit 332 will generate the body bias voltage VsubN to be less than or equal to the nominal negative body bias voltage −VnegN, and the voltage generator circuit 332 will generate the body bias voltage VsubP to be less negative (perhaps even at ground or being positive) than the nominal negative body bias voltage −VnegP.

More generally speaking: a) if the digital code for the process characteristic specifies slow pMOS, the body bias voltage VsubP is generated with a negative voltage −VnegP of sufficient magnitude to satisfy reliability needs in terms of ensuring against unwanted data flip; b) if the digital code for the process characteristic specifies fast pMOS, the body bias voltage VsubP is generated with a lower magnitude (perhaps even ground voltage level) negative voltage −VnegP of sufficient magnitude to satisfy reliability needs in terms of ensuring against unwanted data flip; c) if the digital code for the process characteristic specifies fast nMOS, the body bias voltage VsubN is generated with a negative voltage −VnegN of sufficient magnitude to satisfy reliability needs in terms of ensuring against unwanted data flip and further to provide for an optimization of power consumption; and d) if the digital code for the process characteristic specifies slow nMOS, the body bias voltage VsubP is generated with a lower magnitude (perhaps even ground voltage level) negative voltage −VnegP of sufficient magnitude to satisfy reliability needs in terms of ensuring against unwanted data flip without degrading read current both in the context of absolute value as well as local variations.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An in-memory computation circuit, comprising:
   a memory array including a plurality of static random access memory (SRAM) cells arranged in a matrix with plural rows and plural columns, each row including a word line connected to the SRAM cells of the row, and each column including at least one bit line connected to the SRAM cells of the column;
   wherein each SRAM cell includes a first body bias voltage line connected to body nodes of first-type transistors of the SRAM cell;
   a word line drive circuit for each row having an output connected to drive the word line of the row;
   a row controller circuit configured to simultaneously actuate the plurality of word lines by applying pulses through the word line driver circuits to the word lines for an in-memory compute operation;
   a column processing circuit connected to the at least one bit line for each column and configured to process analog voltages developed on the bit lines in response to the simultaneous actuation of the plurality of word lines to generate a decision output for the in-memory compute operation; and
   a voltage generator circuit configured to generate a first modulated body bias voltage applied to the first body bias voltage line, said first modulated body bias voltage having a non-negative voltage level prior to the simultaneous actuation of the plurality of word lines for the in-memory compute operation, and said first modulated body bias voltage having a negative voltage level during the simultaneous actuation of the plurality of word lines for the in-memory compute operation;
   wherein the voltage generating circuit is controlled to generate an optimal level of the negative voltage level for ensuring against unwanted flip during the in-memory compute operation of data stored in the SRAM cell; and
   wherein the optimal level is selected based on integrated circuit temperature condition.

2. The in-memory computation circuit of claim 1, wherein said first-type transistors of the SRAM cell are p-channel transistors.

3. The in-memory computation circuit of claim 1, wherein the voltage generator circuit is an adjustable voltage regulator configured to adjust the negative voltage level.

4. The in-memory computation circuit of claim 3, further comprising a control circuit configured to generate a control signal for application to the voltage generator circuit.

5. The in-memory computation circuit of claim 4, wherein the control signal is configured to cause modulation of the negative voltage level away from a nominal level in response to an applicable integrated circuit process corner for transistors of the SRAM cells.

6. The in-memory computation circuit of claim 1, wherein each SRAM cell further includes a second body bias voltage line connected to body nodes of second-type transistors of the SRAM cell, and wherein said voltage generator circuit is further configured to generate a second modulated body bias voltage applied to the second body bias voltage line, said second modulated body bias voltage having a non-negative voltage level prior to the simultaneous actuation of the plurality of word lines for the in-memory compute operation, and said second modulated body bias voltage having a negative voltage level during the simultaneous actuation of the plurality of word lines for the in-memory compute operation.

7. The in-memory computation circuit of claim 6, wherein said first-type transistors of the SRAM cell are p-channel transistors and wherein said second-type transistors of the SRAM cell are n-channel transistors.

8. The in-memory computation circuit of claim 1, wherein the voltage generator circuit comprises a voltage boosting circuit configured to boost the first modulated body bias voltage from ground voltage to the negative voltage level in response to a control signal.

9. The in-memory computation circuit of claim 8, wherein the control signal is asserted in response to performance of the in-memory compute operation.

10. The in-memory computation circuit of claim 1, wherein the voltage generating circuit further includes a switching circuit configured to selectively apply one of the negative voltage level and the non-negative voltage level to the first body bias voltage line of the SRAM cell.

11. The in-memory computation circuit of claim 1, wherein the optimal level is further selected based on integrated circuit process condition.

12. An in-memory computation circuit, comprising:
a memory array including a plurality of static random access memory (SRAM) cells arranged in a matrix with plural rows and plural columns, each row including a word line connected to the SRAM cells of the row, and each column including at least one bit line connected to the SRAM cells of the column;
wherein each SRAM cell includes a first body bias voltage line connected to body nodes of first-type transistors of the SRAM cell;
a word line drive circuit for each row having an output connected to drive the word line of the row;
a row controller circuit configured to simultaneously actuate the plurality of word lines by applying pulses through the word line driver circuits to the word lines for an in-memory compute operation;
a column processing circuit connected to the at least one bit line for each column and configured to process analog voltages developed on the bit lines in response to the simultaneous actuation of the plurality of word lines to generate a decision output for the in-memory compute operation;
a voltage generator circuit configured to generate a first modulated body bias voltage applied to the first body bias voltage line, said first modulated body bias voltage having a non-negative voltage level prior to the simultaneous actuation of the plurality of word lines for the in-memory compute operation, and said first modulated body bias voltage having a negative voltage level during the simultaneous actuation of the plurality of word lines for the in-memory compute operation;
wherein the voltage generator circuit is an adjustable voltage regulator configured to adjust the negative voltage level dependent on integrated circuit process and/or temperature conditions; and
a control circuit configured to generate a control signal for application to the voltage generator circuit;
wherein the control signal is configured to cause modulation of the negative voltage level away from a nominal level in response to an applicable integrated circuit process corner for transistors of the SRAM cells; and
wherein the applicable integrated circuit process corner is indicated by a programmed code stored in the control circuit, and wherein the control circuit includes a lookup table (LUT) correlating the programmed code to a value of the control signal.

13. The in-memory computation circuit of claim 12, wherein each SRAM cell further includes a second body bias voltage line connected to body nodes of second-type transistors of the SRAM cell, and wherein said voltage generator circuit is further configured to generate a second modulated body bias voltage applied to the second body bias voltage line, said second modulated body bias voltage having a non-negative voltage level prior to the simultaneous actuation of the plurality of word lines for the in-memory compute operation, and said second modulated body bias voltage having a negative voltage level during the simultaneous actuation of the plurality of word lines for the in-memory compute operation.

14. The in-memory computation circuit of claim 13, wherein said first-type transistors of the SRAM cell are p-channel transistors and wherein said second-type transistors of the SRAM cell are n-channel transistors.

15. The in-memory computation circuit of claim 12, wherein the voltage generator circuit comprises a voltage boosting circuit configured to boost the first modulated body bias voltage from ground voltage to the negative voltage level in response to a control signal.

16. The in-memory computation circuit of claim 15, wherein the control signal is asserted in response to performance of the in-memory compute operation.

17. The in-memory computation circuit of claim 12, wherein the voltage generating circuit further includes a switching circuit configured to selectively apply one of the negative voltage level and the non-negative voltage level to the first body bias voltage line of the SRAM cell.

18. An in-memory computation circuit, comprising:
a memory array including a plurality of static random access memory (SRAM) cells arranged in a matrix with plural rows and plural columns, each row including a word line connected to the SRAM cells of the row, and each column including at least one bit line connected to the SRAM cells of the column;
wherein each SRAM cell includes a first body bias voltage line connected to body nodes of first-type transistors of the SRAM cell;
a word line drive circuit for each row having an output connected to drive the word line of the row;
a row controller circuit configured to simultaneously actuate the plurality of word lines by applying pulses through the word line driver circuits to the word lines for an in-memory compute operation;
a column processing circuit connected to the at least one bit line for each column and configured to process analog voltages developed on the bit lines in response to the simultaneous actuation of the plurality of word lines to generate a decision output for the in-memory compute operation;
a voltage generator circuit configured to generate a first modulated body bias voltage applied to the first body bias voltage line, said first modulated body bias voltage having a non-negative voltage level prior to the simultaneous actuation of the plurality of word lines for the in-memory compute operation, and said first modulated body bias voltage having a negative voltage level during the simultaneous actuation of the plurality of word lines for the in-memory compute operation;
wherein the voltage generator circuit is an adjustable voltage regulator configured to adjust the negative voltage level dependent on integrated circuit process and/or temperature conditions; and
a control circuit configured to generate a control signal for application to the voltage generator circuit;
wherein the control signal is configured to cause modulation of the negative voltage level away from a nominal level in response to an applicable integrated circuit process corner for transistors of the SRAM cells; and
wherein the control circuit further comprises a temperature sensor, and wherein the control signal is configured to cause a temperature dependent tuning of the negative voltage level.

19. The in-memory computation circuit of claim 18, wherein the control circuit includes a lookup table (LUT) correlating sensed integrated circuit temperature to a tuning level for the value of the control signal.

20. The in-memory computation circuit of claim 18, wherein each SRAM cell further includes a second body bias voltage line connected to body nodes of second-type transistors of the SRAM cell, and wherein said voltage generator circuit is further configured to generate a second modulated body bias voltage applied to the second body bias voltage line, said second modulated body bias voltage having a non-negative voltage level prior to the simultaneous actuation of the plurality of word lines for the in-memory compute operation, and said second modulated body bias voltage having a negative voltage level during the simultaneous actuation of the plurality of word lines for the in-memory compute operation.

21. The in-memory computation circuit of claim 20, wherein said first-type transistors of the SRAM cell are p-channel transistors and wherein said second-type transistors of the SRAM cell are n-channel transistors.

22. The in-memory computation circuit of claim 18, wherein the voltage generator circuit comprises a voltage boosting circuit configured to boost the first modulated body bias voltage from ground voltage to the negative voltage level in response to a control signal.

23. The in-memory computation circuit of claim 22, wherein the control signal is asserted in response to performance of the in-memory compute operation.

24. The in-memory computation circuit of claim 18, wherein the voltage generating circuit further includes a switching circuit configured to selectively apply one of the negative voltage level and the non-negative voltage level to the first body bias voltage line of the SRAM cell.

25. An in-memory computation circuit, comprising:
a memory array including a plurality of static random access memory (SRAM) cells arranged in a matrix with plural rows and plural columns, each row including a word line connected to the SRAM cells of the row, and each column including at least one bit line connected to the SRAM cells of the column;
wherein each SRAM cell includes a first body bias voltage line connected to body nodes of first-type transistors of the SRAM cell;
a word line drive circuit for each row having an output connected to drive the word line of the row;
a row controller circuit configured to simultaneously actuate the plurality of word lines by applying pulses through the word line driver circuits to the word lines for an in-memory compute operation;
a column processing circuit connected to the at least one bit line for each column and configured to process analog voltages developed on the bit lines in response to the simultaneous actuation of the plurality of word lines to generate a decision output for the in-memory compute operation; and
a voltage generator circuit configured to generate a first modulated body bias voltage applied to the first body bias voltage line, said first modulated body bias voltage having a non-negative voltage level prior to the simultaneous actuation of the plurality of word lines for the in-memory compute operation, and said first modulated body bias voltage having a negative voltage level during the simultaneous actuation of the plurality of word lines for the in-memory compute operation;
wherein the voltage generator circuit is an adjustable voltage regulator configured to adjust the negative voltage level dependent on integrated circuit process and/or temperature conditions; and
a control circuit configured to generate a control signal for application to the voltage generator circuit;
wherein the control circuit further comprises a temperature sensor, and wherein the control signal is configured to cause modulation of the negative voltage level away from a nominal level in response to an integrated circuit temperature sensed by the temperature sensor.

26. The in-memory computation circuit of claim 25, wherein the control circuit includes a lookup table (LUT) correlating sensed integrated circuit temperature to a value of the control signal.

27. The in-memory computation circuit of claim 25, wherein each SRAM cell further includes a second body bias voltage line connected to body nodes of second-type transistors of the SRAM cell, and wherein said voltage generator circuit is further configured to generate a second modulated body bias voltage applied to the second body bias voltage line, said second modulated body bias voltage having a non-negative voltage level prior to the simultaneous actuation of the plurality of word lines for the in-memory compute operation, and said second modulated body bias voltage having a negative voltage level during the simultaneous actuation of the plurality of word lines for the in-memory compute operation.

28. The in-memory computation circuit of claim 27, wherein said first-type transistors of the SRAM cell are p-channel transistors and wherein said second-type transistors of the SRAM cell are n-channel transistors.

29. The in-memory computation circuit of claim 25, wherein the voltage generator circuit comprises a voltage boosting circuit configured to boost the first modulated body bias voltage from ground voltage to the negative voltage level in response to a control signal.

30. The in-memory computation circuit of claim 29, wherein the control signal is asserted in response to performance of the in-memory compute operation.

31. The in-memory computation circuit of claim 25, wherein the voltage generating circuit further includes a switching circuit configured to selectively apply one of the negative voltage level and the non-negative voltage level to the first body bias voltage line of the SRAM cell.

32. An in-memory computation circuit, comprising:
a memory array including a plurality of static random access memory (SRAM) cells arranged in a matrix with plural rows and plural columns, each row including a word line connected to the SRAM cells of the row, and each column including at least one bit line connected to the SRAM cells of the column;
wherein each SRAM cell includes a first body bias voltage line connected to body nodes of first-type transistors of the SRAM cell;
a word line drive circuit for each row having an output connected to drive the word line of the row;
a row controller circuit configured to simultaneously actuate the plurality of word lines by applying pulses through the word line driver circuits to the word lines for an in-memory compute operation;
a column processing circuit connected to the at least one bit line for each column and configured to process analog voltages developed on the bit lines in response to the simultaneous actuation of the plurality of word lines to generate a decision output for the in-memory compute operation; and
a voltage generator circuit configured to generate a first modulated body bias voltage applied to the first body bias voltage line, said first modulated body bias voltage having a non-negative voltage level prior to the simultaneous actuation of the plurality of word lines for the in-memory compute operation, and said first modulated body bias voltage having a negative voltage level during the simultaneous actuation of the plurality of word lines for the in-memory compute operation;
wherein the voltage generator circuit comprises a voltage boosting circuit configured to boost the first modulated body bias voltage from ground voltage to the negative voltage level in response to a control signal; and wherein the boost of the first modulated body bias voltage is provided by a capacitive voltage boosting circuit comprising:

a transistor having a source coupled to receive the ground voltage, a drain coupled to the first body bias voltage line of the SRAM cell and a gate configured to receive the control signal; and a capacitor having a first terminal coupled to receive the control signal and a second terminal coupled to the drain.

33. The in-memory computation circuit of claim 32, wherein each SRAM cell further includes a second body bias voltage line connected to body nodes of second-type transistors of the SRAM cell, and wherein said voltage generator circuit is further configured to generate a second modulated body bias voltage applied to the second body bias voltage line, said second modulated body bias voltage having a non-negative voltage level prior to the simultaneous actuation of the plurality of word lines for the in-memory compute operation, and said second modulated body bias voltage having a negative voltage level during the simultaneous actuation of the plurality of word lines for the in-memory compute operation.

34. The in-memory computation circuit of claim 33, wherein said first-type transistors of the SRAM cell are p-channel transistors and wherein said second-type transistors of the SRAM cell are n-channel transistors.

35. The in-memory computation circuit of claim 32, wherein the voltage generator circuit comprises a voltage boosting circuit configured to boost the first modulated body bias voltage from ground voltage to the negative voltage level in response to a control signal.

36. The in-memory computation circuit of claim 35, wherein the control signal is asserted in response to performance of the in-memory compute operation.

37. The in-memory computation circuit of claim 32, wherein the voltage generating circuit further includes a switching circuit configured to selectively apply one of the negative voltage level and the non-negative voltage level to the first body bias voltage line of the SRAM cell.

38. An in-memory computation circuit, comprising:

a memory array including a plurality of static random access memory (SRAM) cells arranged in a matrix with plural rows and plural columns, each row including a word line connected to the SRAM cells of the row, and each column including at least one bit line connected to the SRAM cells of the column;

wherein each SRAM cell includes a first body bias voltage line connected to body nodes of first-type transistors of the SRAM cell;

a word line drive circuit for each row having an output connected to drive the word line of the row;

a row controller circuit configured to simultaneously actuate the plurality of word lines by applying pulses through the word line driver circuits to the word lines for an in-memory compute operation;

a column processing circuit connected to the at least one bit line for each column and configured to process analog voltages developed on the bit lines in response to the simultaneous actuation of the plurality of word lines to generate a decision output for the in-memory compute operation; and a voltage generator circuit configured to generate a first modulated body bias voltage applied to the first body bias voltage line, said first modulated body bias voltage having a non-negative voltage level prior to the simultaneous actuation of the plurality of word lines for the in-memory compute operation, and said first modulated body bias voltage having a negative voltage level during the simultaneous actuation of the plurality of word lines for the in-memory compute operation;

wherein the voltage generator circuit comprises a voltage boosting circuit configured to boost the first modulated body bias voltage from ground voltage to the negative voltage level in response to a control signal; and wherein the boost of the first modulated body bias voltage is provided by a capacitive voltage boosting circuit comprising:

a transistor having a source coupled to receive the ground voltage, a drain coupled to the first body bias voltage line of the SRAM cell and a gate configured to receive the control signal; and a plurality of switched capacitor circuits coupled to receive the control signal and further coupled to the drain;

wherein the switched capacitor circuits are selectively actuated in order to tune a level of the modulated body bias voltage.

39. The in-memory computation circuit of claim 38, wherein tuning of the level is made based on integrated circuit process condition.

40. The in-memory computation circuit of claim 38, wherein tuning of the level is made based on integrated circuit temperature condition.

41. The in-memory computation circuit of claim 38, wherein each SRAM cell further includes a second body bias voltage line connected to body nodes of second-type transistors of the SRAM cell, and wherein said voltage generator circuit is further configured to generate a second modulated body bias voltage applied to the second body bias voltage line, said second modulated body bias voltage having a non-negative voltage level prior to the simultaneous actuation of the plurality of word lines for the in-memory compute operation, and said second modulated body bias voltage having a negative voltage level during the simultaneous actuation of the plurality of word lines for the in-memory compute operation.

42. The in-memory computation circuit of claim 41, wherein said first-type transistors of the SRAM cell are p-channel transistors and wherein said second-type transistors of the SRAM cell are n-channel transistors.

43. The in-memory computation circuit of claim 38, wherein the voltage generator circuit comprises a voltage boosting circuit configured to boost the first modulated body bias voltage from ground voltage to the negative voltage level in response to a control signal.

44. The in-memory computation circuit of claim 43, wherein the control signal is asserted in response to performance of the in-memory compute operation.

45. The in-memory computation circuit of claim 38, wherein the voltage generating circuit further includes a switching circuit configured to selectively apply one of the negative voltage level and the non-negative voltage level to the first body bias voltage line of the SRAM cell.

46. An in-memory computation circuit, comprising:

a memory array including a plurality of static random access memory (SRAM) cells arranged in a matrix with plural rows and plural columns, each row including a word line connected to the SRAM cells of the row, and each column including at least one bit line connected to the SRAM cells of the column;

wherein each SRAM cell includes a first body bias voltage line connected to first body nodes of first-type transistors of the SRAM and a second body bias voltage line connected to second body nodes of second-type transistors of the SRAM;

a word line drive circuit for each row having an output connected to drive the word line of the row;

a row controller circuit configured to simultaneously actuate the plurality of word lines by applying pulses through the word line driver circuits to the word lines for an in-memory compute operation;

a column processing circuit connected to the at least one bit line for each column and configured to process analog voltages developed on the bit lines in response to the simultaneous actuation of the plurality of word lines to generate a decision output for the in-memory compute operation; and a voltage generator circuit configured to generate a first modulated body bias voltage applied to the first body bias voltage line and generate a second modulated body bias voltage applied to the second body bias voltage line, wherein the voltage generator circuit switches the first modulated body bias voltage to a first negative voltage level during the simultaneous actuation of the plurality of word lines for the in-memory compute operation, and wherein the voltage generator circuit switches the second modulated body bias voltage to a second negative voltage level during the simultaneous actuation of the plurality of word lines for the in-memory compute operation;

wherein the voltage generator circuit is configured to adjust each of the first and second negative voltage levels dependent on integrated circuit process and/or temperature conditions; and wherein the adjusted first and second negative voltage levels are optimal levels for ensuring against unwanted flip during the in-memory compute operation of data stored in the SRAM cell.

47. The in-memory computation circuit of claim 46, wherein said first-type transistors of the SRAM cell are p-channel transistors, and wherein said second-type transistors of the SRAM cell are n-channel transistors.

48. The in-memory computation circuit of claim 46, wherein the voltage generator circuit is further configured to apply a non-negative voltage level as the first and second modulated body bias voltages prior to the simultaneous actuation of the plurality of word lines for the in-memory compute operation.

49. The in-memory computation circuit of claim 48, wherein the non-negative voltage level is ground.

50. The in-memory computation circuit of claim 46, wherein the voltage generator circuit is configured to adjust each of the first and second negative voltage levels dependent on integrated circuit process condition.

51. The in-memory computation circuit of claim 50, wherein the adjusted first and second negative voltage levels are optimal levels for ensuring against unwanted flip during the in-memory compute operation of data stored in the SRAM cell.

* * * * *